(12) United States Patent
Lowrance et al.

(10) Patent No.: US 9,034,428 B2
(45) Date of Patent: May 19, 2015

(54) FACE-DOWN PRINTING APPARATUS AND METHOD

(75) Inventors: Robert Lowrance, Los Gatos, CA (US); Eliyahu Vronsky, Los Altos, CA (US); Conor Madigan, San Francisco, CA (US); Alexander Sou-Kang Ko, Santa Clara, CA (US)

(73) Assignee: Kateeva, Inc., Menlo Park, CA (US)

( * ) Notice: Subject to any disclaimer, the term of this patent is extended or adjusted under 35 U.S.C. 154(b) by 155 days.

(21) Appl. No.: 13/571,166

(22) Filed: Aug. 9, 2012

(65) Prior Publication Data

US 2013/0040061 A1 Feb. 14, 2013

Related U.S. Application Data

(60) Provisional application No. 61/521,631, filed on Aug. 9, 2011, provisional application No. 61/613,348, filed on Mar. 20, 2012.

(51) Int. Cl.
*B41J 2/155* (2006.01)
*B41J 3/407* (2006.01)
*B41J 13/16* (2006.01)
*H01L 51/56* (2006.01)

(52) U.S. Cl.
CPC .......... *B41J 2/155* (2013.01); *H01L 51/56* (2013.01); *B41J 3/407* (2013.01); *B41J 13/16* (2013.01); *B41J 2202/20* (2013.01)

(58) Field of Classification Search
CPC ........ B41J 3/407; B41J 2202/20; B41J 13/16; B41J 2/155
USPC ................. 427/421.1; 118/300, 500
See application file for complete search history.

(56) References Cited

U.S. PATENT DOCUMENTS

| | | | |
|---|---|---|---|
| 3,216,858 A | 11/1965 | Bogdanowski | |
| 3,498,343 A | 3/1970 | Sperberg | |
| 3,670,466 A | 6/1972 | Lynch | |
| 3,885,362 A | 5/1975 | Pollock | |
| 4,226,897 A | 10/1980 | Coleman | |
| 4,581,478 A | 4/1986 | Pugh et al. | |
| 5,029,518 A | 7/1991 | Austin | |
| 5,314,377 A | 5/1994 | Pelosi, III | |
| 5,344,365 A | 9/1994 | Scott et al. | |
| 5,896,154 A * | 4/1999 | Mitani et al. .................. 347/102 |
| 6,023,899 A | 2/2000 | Mecozzi | |

(Continued)

FOREIGN PATENT DOCUMENTS

WO WO 2006/021568 3/2006

OTHER PUBLICATIONS

International Search Report and Written Opinion issued on Jan. 17, 2013, to PCT Application No. PCT/US2012/050207.

(Continued)

*Primary Examiner* — Xiao Zhao

(57) ABSTRACT

Film-forming apparatuses, systems, and methods are provided. The apparatus can include a substrate positioning system and a printing array that includes an inkjet printing array and/or a thermal printing array. The positioning system can be a gas-bearing plate system. The positioning system can be configured to move a substrate between a first position, away from the printing array, and a second position, above the printing array. The apparatuses, systems, and methods can be used to manufacture organic light emitting devices (OLEDs), for example, flat panel displays.

16 Claims, 28 Drawing Sheets

(56) References Cited

U.S. PATENT DOCUMENTS

| | | | |
|---|---|---|---|
| 6,049,167 A | 4/2000 | Onitsuka et al. | |
| 6,086,679 A | 7/2000 | Lee et al. | |
| 6,089,282 A | 7/2000 | Spiegelmann et al. | |
| 6,375,304 B1 | 4/2002 | Aldrich et al. | |
| 6,437,351 B1 | 8/2002 | Smick et al. | |
| 7,023,013 B2 | 4/2006 | Ricks et al. | |
| 7,258,768 B2 | 8/2007 | Yamazaki | |
| 7,326,300 B2 | 2/2008 | Sun et al. | |
| 7,703,911 B2 | 4/2010 | Chung et al. | |
| 8,383,202 B2 | 2/2013 | Somekh et al. | |
| 8,720,366 B2 | 5/2014 | Somekh et al. | |
| 2002/0033860 A1* | 3/2002 | Kubota et al. | 347/36 |
| 2002/0079057 A1 | 6/2002 | Yoshioka et al. | |
| 2002/0084464 A1 | 7/2002 | Yamazaki et al. | |
| 2002/0124906 A1 | 9/2002 | Suzuki et al. | |
| 2003/0000476 A1 | 1/2003 | Matsunaga et al. | |
| 2003/0097929 A1 | 5/2003 | Watanabe et al. | |
| 2003/0175414 A1 | 9/2003 | Hayashi | |
| 2004/0009304 A1 | 1/2004 | Pichler | |
| 2004/0050325 A1 | 3/2004 | Samoilov et al. | |
| 2004/0086631 A1 | 5/2004 | Han | |
| 2004/0115339 A1 | 6/2004 | Ito | |
| 2004/0123804 A1 | 7/2004 | Yamazaki et al. | |
| 2005/0005850 A1 | 1/2005 | Yamazaki | |
| 2005/0062773 A1 | 3/2005 | Fouet | |
| 2005/0140764 A1 | 6/2005 | Chang et al. | |
| 2005/0223994 A1 | 10/2005 | Blomiley et al. | |
| 2006/0099328 A1 | 5/2006 | Waite et al. | |
| 2006/0219605 A1 | 10/2006 | Devitt | |
| 2006/0236938 A1 | 10/2006 | Powell et al. | |
| 2007/0044713 A1 | 3/2007 | Yasui et al. | |
| 2007/0257033 A1 | 11/2007 | Yamada | |
| 2008/0241587 A1 | 10/2008 | Ohmi et al. | |
| 2008/0308037 A1 | 12/2008 | Bulovic et al. | |
| 2009/0078204 A1 | 3/2009 | Kerr et al. | |
| 2009/0081885 A1 | 3/2009 | Levy et al. | |
| 2010/0182359 A1 | 7/2010 | Kim et al. | |
| 2010/0201749 A1 | 8/2010 | Somekh et al. | |
| 2011/0043554 A1 | 2/2011 | Silverbrook et al. | |
| 2011/0096124 A1 | 4/2011 | North et al. | |
| 2011/0318503 A1 | 12/2011 | Adams et al. | |
| 2012/0056923 A1 | 3/2012 | Vronsky et al. | |
| 2012/0306951 A1 | 12/2012 | Somekh et al. | |
| 2013/0004656 A1 | 1/2013 | Chen et al. | |
| 2013/0038649 A1 | 2/2013 | Lowrance et al. | |
| 2013/0040061 A1 | 2/2013 | Lowrance et al. | |
| 2013/0164438 A1 | 6/2013 | Somekh et al. | |
| 2013/0164439 A1 | 6/2013 | Somekh et al. | |
| 2013/0206058 A1 | 8/2013 | Mauck et al. | |
| 2013/0209669 A1 | 8/2013 | Somekh et al. | |
| 2013/0209670 A1 | 8/2013 | Somekh et al. | |
| 2013/0209671 A1 | 8/2013 | Somekh et al. | |
| 2013/0252533 A1 | 9/2013 | Mauck et al. | |
| 2013/0307898 A1 | 11/2013 | Somekh et al. | |

OTHER PUBLICATIONS

Non-Final Office Action issued on Apr. 24, 2013, to U.S. Appl. No. 13/551,209.
Applicant-Initiated Interview Summary dated Aug. 15, 2013 for U.S. Appl. No. 13/551,209.
Notice of Allowance issued on Feb. 20, 2014, to U.S. Appl. No. 13/551,209.
Non-Final Office Action issued on Feb. 7, 2014, to U.S. Appl. No. 13/773,643.
Notice of Allowance issued on Jun. 30, 2014, to U.S. Appl. No. 13/773,643.
Non-Final Office Action issued on Feb. 28, 2014, to U.S. Appl. No. 13/773,649.
Notice of Allowance issued on Jul. 1, 2014, to U.S. Appl. No. 13/773,649.
Notice of Allowance mailed on Sep. 29, 2014, to U.S. Appl. No. 13/773,654.
Non-Final Office Action issued on Dec. 31, 2013, to U.S. Appl. No. 13/774,577.
Notice of Allowance issued on Jul. 2, 2014, to U.S. Appl. No. 13/774,577.
International Search Report and Written Opinion issued on Dec. 22, 2014, to PCT Application No. PCT/US2014/023820.
International Search Report and Written Opinion issued on Mar. 11, 2014 to PCT Application PCT/US13/063128.
Street et al., "Jet Printing of Active-Matrix TFT Backplanes for Displays and Sensors", IS&T Archiving, Dec. 2005, vol. 20, No. 5, 16 pages.
Forrest, Stephen R., "The Path to Ubiquitous and Low-cost Organic Electronic Appliances on Plastic," Nature, Apr. 29, 2004, vol. 428, 8 pages.
International Search Report and Written Opinion issued on Feb. 26, 2013 for PCT Application No. PCT/US12/70717.
International Search Report and Written Opinion issued on Jun. 18, 2013 for PCT Application No. PCT/US13/031083.
International Search Report and Written Opinion issued to PCT Application PCT/US14/037722.
International Search Report and Written Opinion issued to PCT Application PCT/US12/050207.
Non-Final Office Action issued on Jun. 14, 2012, to U.S. Appl. No. 12/652,040.
Applicant-Initiated Interview Summary dated Oct. 19, 2012 for U.S. Appl. No. 12/652,040.
Notice of Allowance issued on Dec. 7, 2012 to U.S. Appl. No. 12/652,040.
Final Office Action issued on Nov. 8, 2013, to U.S. Appl. No. 13/551,209.
Final Office Action issued on Jun. 12, 2014, to U.S. Appl. No. 13/773,643.
Final Office Action issued on Jun. 18, 2014, to U.S. Appl. No. 13/774,577.
Final Office Action issued on Jun. 10, 2014, to U.S. Appl. No. 13/773,649.
Non-Final Office Action mailed on Jul. 1, 2014, to U.S. Appl. No. 13/773,654.
Non-Final Office Action issued on Apr. 28, 2014, to U.S. Appl. No. 13/720,830.
Non-Final Office Action issued on May 16, 2014, to U.S. Appl. No. 13/802,304.
Applicant-Initiated Interview Summary dated Jun. 30, 2014 for U.S. Appl. No. 13/720,830.
Applicant-Initiated Interview Summary dated Aug. 20, 2014 for U.S. Appl. No. 13/720,830.

* cited by examiner

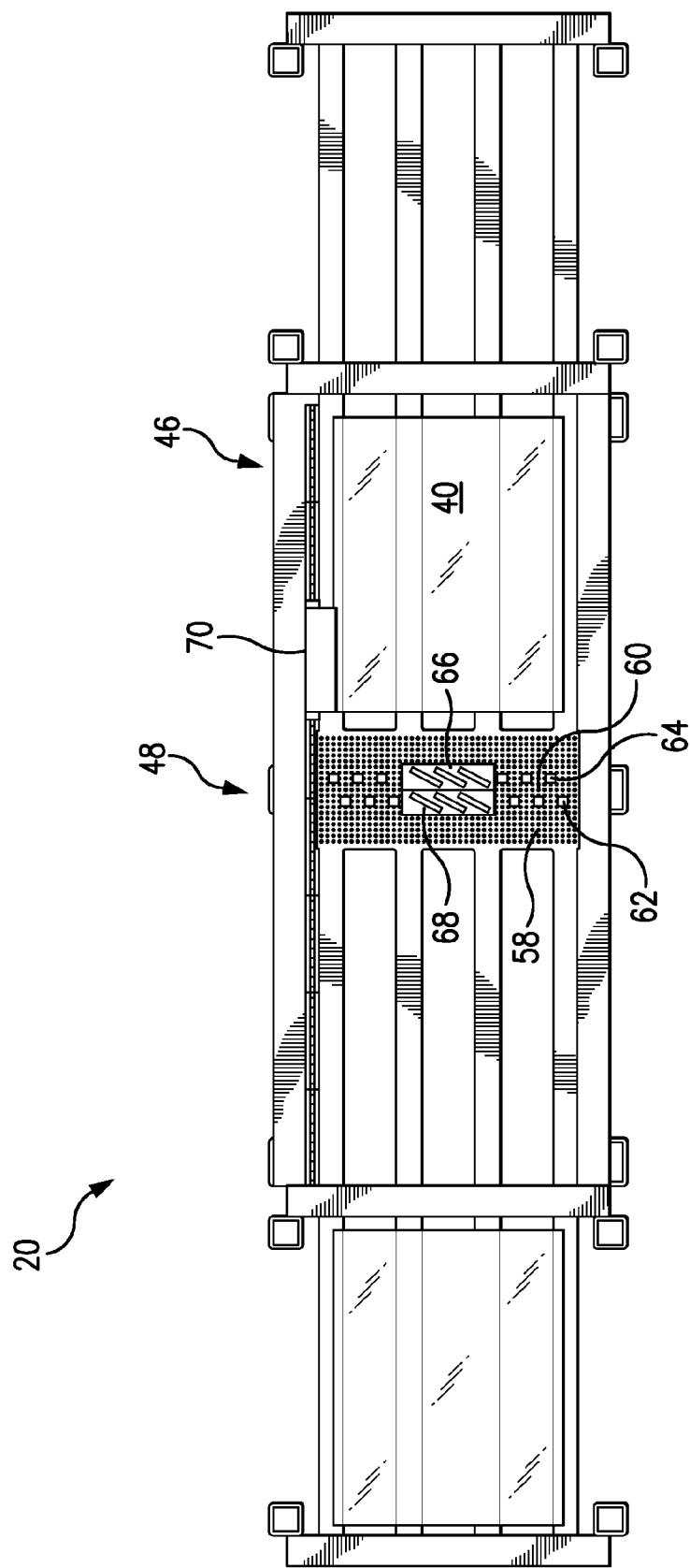

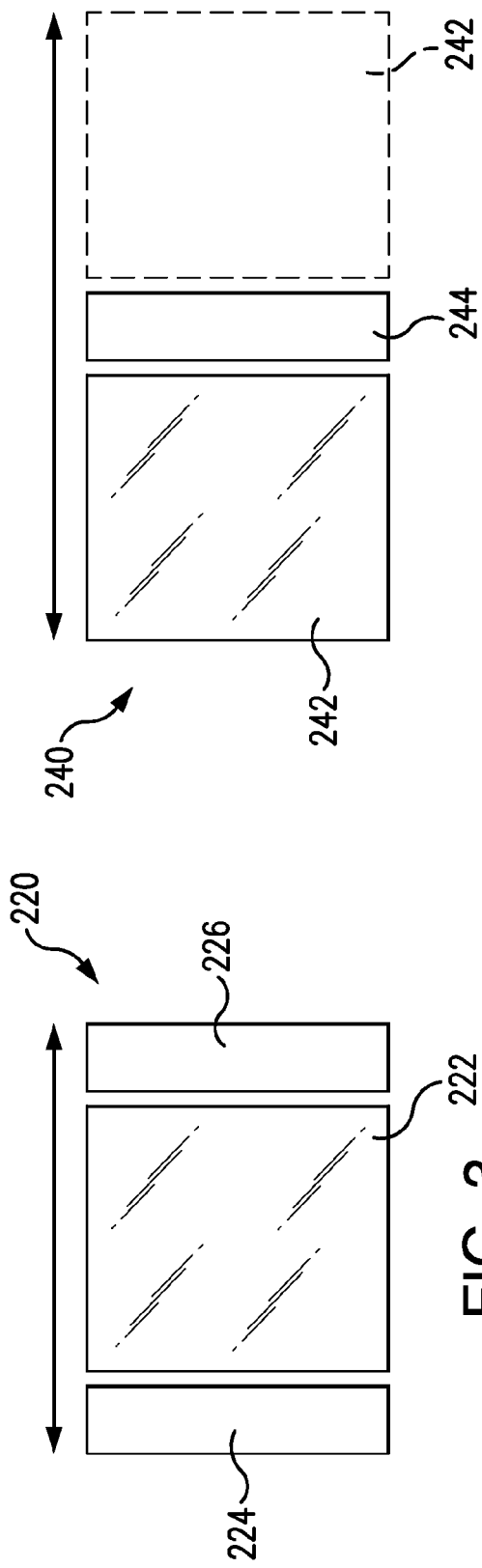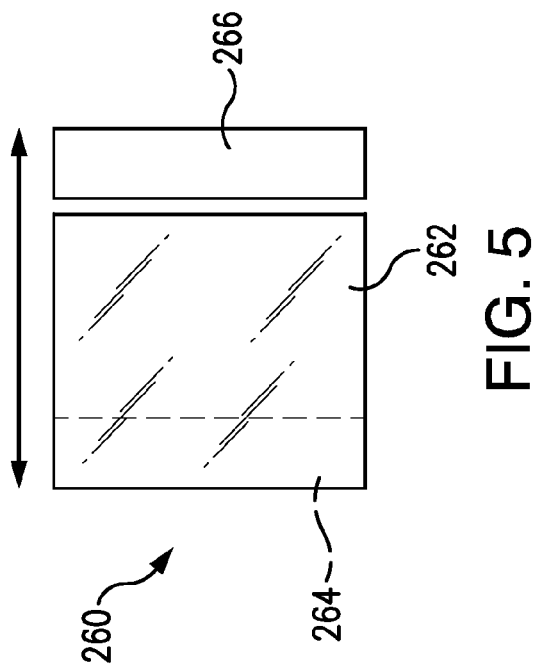

FACE-DOWN PRINTING APPARATUS AND METHOD

CROSS-REFERENCE TO RELATED APPLICATION

The present application claims the benefit of U.S. Provisional Patent Applications Nos. 61/521,631, filed Aug. 9, 2011, and 61/613,348, filed Mar. 20, 2012, which are incorporated herein in their entireties by reference.

FIELD

The present teachings relate to thermal and inkjet printing systems, apparatuses, and methods for manufacturing various products such as organic light emitting devices.

BACKGROUND

It can be beneficial for a printhead, devised for the deposition of ink without contacting a surface on which the ink is to be deposited, to maintain a tightly controlled gap between the printhead and the printed surface of a substrate. If the printhead is too far away from the substrate surface, the printing can be too diffuse. If the printhead is too close to the substrate surface, printing can be too granular. When too close, the printhead may even contact the substrate, resulting in damage to both the substrate and the printhead. Positioning a substrate in a horizontal plane can also affect printing quality and efficiency. Horizontal positioning is complicated by the need to reapply ink to the printhead without interfering with the substrate. Accordingly, there exists a need to control both the print gap between the substrate and the printhead and to control the horizontal position of the substrate relative to printhead arrays, to optimize both the printing results and the printing process.

SUMMARY

According to various embodiments of the present teachings, a film-forming apparatus is provided that comprises a printing array and a conveyor/support apparatus configured to support a substrate, wherein the substrate has a surface upon which a film is to be formed and the surface faces downwardly during printing. The apparatus can comprise a positioning system configured to move the substrate between a first position away from the printing array, and a second position above the printing array. In some embodiments, the printing array comprises an inkjet array. In some embodiments, the printing array comprises a thermal printing array and the apparatus further comprises an inkjet array adapted to load the thermal printing array with film-forming material.

According to various embodiments of the present teachings, a film-forming apparatus is provided that comprises a substrate support including a top surface and at least one opening in the top surface. The film-forming apparatus can further comprise a gas bearing system, for example, a gas bearing system comprising a first plurality of apertures in the top surface and a first plurality of gas channels extending from the apertures into the substrate support. In some embodiments a fluid can be used but for the sake of simplicity the fluids described herein will be referred to as gasses. The gas channels described herein can more broadly be fluid channels, but for the sake of simplicity, will be referred to herein as gas channels. The gas channels can communicate with a first manifold configured, for example, to supply the gas channels with a pressurized gas. The gas bearing system can also comprise a second plurality of apertures in the top surface and a second plurality of gas channels extending from the second plurality of apertures into the substrate support and communicating with a second manifold. The first plurality of apertures and the second plurality of apertures can surround the at least one opening in the top surface, and, when plural openings are provided, can surround each of the plurality of openings independently. The film-forming apparatus can further comprise a respective printing array disposed in each of the openings. The gas bearing system can be configured to float a substrate above the top surface while the printing array transfers a film-forming material onto a downwardly facing surface of the substrate. Each printing array can be disposed in a respective print module package or can comprise at least part of a respective print module package. In some embodiments, the printing array comprises an inkjet printing array and each inkjet printing array can include one or more upwardly facing inkjet nozzles. In some embodiments, the printing array comprises a thermal printing array and each thermal printing array can include one or more upwardly facing print transfer surfaces.

According to various embodiments of the present teachings, a method of forming a film on a surface of a substrate is provided. The substrate can be positioned in a first position above an upward-facing inkjet printing array set in a gas bearing plate system. The configuration can be arranged such that the substrate surface faces downwardly toward the inkjet printing array. The inkjet printing array can be activated to direct a first film-forming material from the inkjet printing array onto the substrate surface. The substrate can also be arranged in a second position above the inkjet printing array and the inkjet printing array can be activated to direct a second film-forming material from the inkjet printing array onto the substrate surface. Any of the methods of the present teachings can further comprise the use of vacuum thermal evaporation (VTE), for example, to form one or more layers of an OLED.

According to various embodiments of the present teachings, a method of forming a film on a surface of a substrate is provided. The method can comprise a plurality of steps. A first film-forming material can be loaded into microstructures of a thermal printing array. A substrate can be positioned above the thermal printing array such that a surface of the substrate is oriented facing downwardly. The thermal printing array can be heated to thereby direct the first film-forming material from the thermal printing array onto a face-down-oriented surface of the substrate. The substrate can then be moved away from the thermal printing array, the thermal printing array can be reloaded with film-forming material, and the substrate can be positioned to enable printing on a different area of the surface.

BRIEF DESCRIPTION OF THE DRAWINGS

A better understanding of the features and advantages of the present teachings will be obtained with reference to the accompanying drawings, which are intended to illustrate, not limit, the present teachings.

FIG. 1B is a plan view of a configuration of the system shown in FIG. 1A wherein an inkjet array is in position to load film-forming material onto a thermal printing array.

FIG. 3 is a plan view of a substrate printing configuration in accordance with various embodiments of the present teachings and showing the relative direction of movement of a substrate with respect to at least one printing array.

FIG. 4 is a plan view of a substrate printing configuration in accordance with various embodiments of the present teachings and showing the relative direction of movement of a substrate with respect to at least one printing array.

FIG. 5 is a plan view of a substrate printing configuration in accordance with various embodiments of the present teachings and showing the relative direction of movement of a substrate with respect to at least one printing array.

DETAILED DESCRIPTION OF THE DISCLOSURE

Figure 1A:
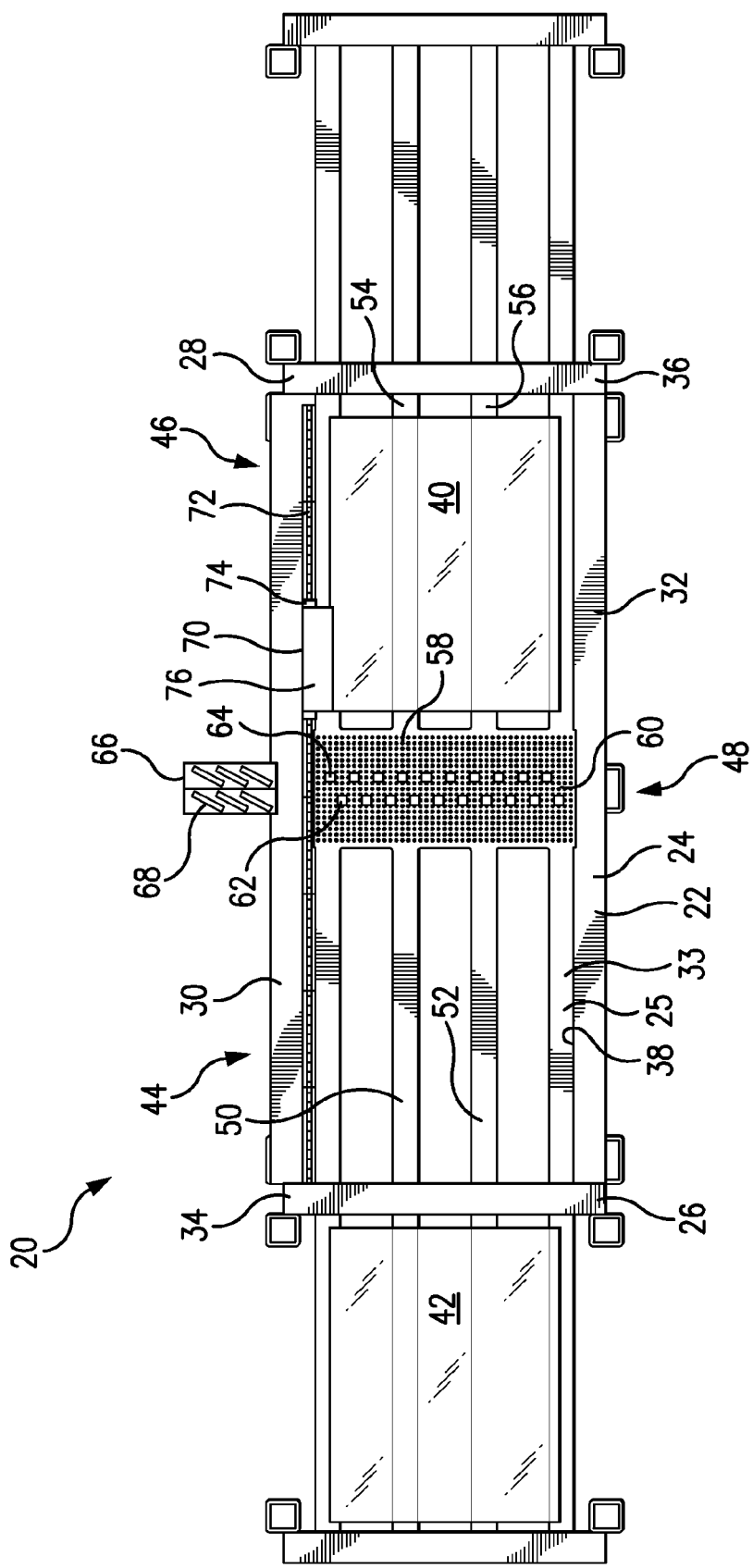
FIG. 1A is a plan view of a system including a process chamber in accordance with various embodiments of the present teachings.

According to various embodiments of the present teachings, a film-forming apparatus is provided that comprises a printing array and a substrate conveyor and support apparatus configured to support and convey a substrate. The substrate has a surface upon which a film is to be formed and the substrate support and conveyor apparatus is configured such that the surface faces downwardly during a film-forming operation. The substrate conveyor and support apparatus can comprise a positioning system configured to move the substrate between a first position that is away from the printing array, and a second position where it is positioned above the printing array and ready to receive material from the printing array. In some embodiments, the printing array comprises an inkjet array. In some embodiments, the printing array instead comprises a thermal printing array and the apparatus further comprises an inkjet array adapted to load the thermal printing array with film-forming material. Printing arrays described herein can be inkjet printing arrays and/or thermal printing arrays, unless otherwise specified.

In embodiments using a thermal printing array, the film-forming apparatus can be configured such that, in the first position, the substrate is positioned away from the thermal printing array so such that it does not obstruct an inkjet printing array from loading the thermal printing array with film-forming material. In the second position the substrate can be positioned such that the downwardly facing surface receives film-forming material during operation of the thermal printing array.

According to various embodiments of the present teachings, the film-forming apparatus can comprise a substrate support comprising a top surface and at least one opening in the top surface. The film-forming apparatus can comprise a gas bearing system and the gas bearing system can comprise a first plurality of apertures in the top surface. A first plurality of gas channels can extend from the first plurality of apertures into the substrate support and be in communication with a first manifold. The gas bearing system can also comprise a second plurality of apertures in the top surface and a second plurality of gas channels that can extend from the second plurality of apertures into the substrate support and be in communication with a second manifold. The first plurality of apertures and the second plurality of apertures can surround the at least one opening in the top surface. The film-forming apparatus can comprise a plurality of printing arrays, for example, a different printing array disposed in each opening of a plurality of openings. The gas bearing system can be configured to float a substrate above the top surface while the printing array transfers a film-forming material onto a downwardly facing surface of the substrate. In some embodiments, the printing array comprises an inkjet printing array and each inkjet printing array can include one or more upwardly facing inkjet nozzles. In some embodiments, the printing array comprises a thermal printing array and each thermal printing array can include one or more upwardly facing print transfer surfaces.

When a thermal printing system is used, the film-forming apparatus can comprise one or more inkjet arrays configured to load one or more thermal printing arrays with film-forming material. A plurality of inkjet arrays can be associated with a plurality of respective thermal printing arrays, for example, in a one-to-one ratio or in any other ratio. Each inkjet array can comprise one or more columns and/or rows of ink printheads. The film-forming apparatus can further comprise one or more corresponding inkjet array actuators configured to convey or translate each inkjet array from a first inkjet array position to a second inkjet array position. The first position can be for loading the thermal printing array with film-forming material and the second inkjet array position can comprise an orientation wherein the inkjet array does not obstruct movement of a substrate between first and second substrate positions.

A conveyor can be provided that is configured to move a substrate between a first position not over the printing array, and a second position over the printing array. The film-forming apparatus can further comprise a housing over the substrate support, which, with the substrate support, can define a printing chamber or process chamber in which the printing array prints film-forming material onto a substrate. The second inkjet position can be inside or outside the process chamber. At least one load-lock chamber can be provided in interruptible gas communication with the printing chamber and adjacent the printing chamber. One or more substrates can be moved from the load-lock chamber to the process chamber, and optionally back to the load-lock chamber. Movement of a substrate into or out of a load-lock chamber or process chamber can take place through a valve and/or door. In some embodiments, the entire system or all but the load-lock chambers can be enclosed in an inert gas enclosure. A system can be provided for evacuating the load-lock chamber and flushing it with an inert gas, for example as described in U.S. Patent Application No. 61/579,233, filed Dec. 22, 2011, which is incorporated herein in its entirety by reference. Other load-lock features and methods of using them, that can be utilized in accordance with various embodiments of the present teachings, include those described, for example, in U.S. Patent Application Publication No. US 2010/0201749 A1, which is incorporated herein in its entirety by reference.

A cleaning and/or maintenance system can be provided for removing excess or residual film-forming material from a printing array. For example the cleaning system can comprise a blotter and/or a vacuum chamber. Examples of blotters include squeegees and spooled cloth for making contact with a printhead, transfer surface, and/or nozzle. The cleaning system and/or maintenance system can be configured to operate as part of a purge sequence during which existing ink is removed and a new ink is introduced to the print array. A purge sequence can also comprise the removal of air, for example, including air bubbles, from the print array.

The first manifold of the gas bearing system can be in fluid communication with an environment outside of the process chamber via a first port, and the second manifold can be in communication with an environment outside of the process chamber via a second port. In some cases, the first plurality of gas channels can be in communication with a pressurized gas source, for example, a pressurized gas source that comprises an inert gas source. The pressurized gas source can comprise a source of nitrogen gas, a source of argon gas, a source of a noble gas, a source of clean dry air (CDA), a combination thereof, or the like. The second plurality of gas channels can be in fluid communication with a vacuum source.

The apertures of the first and second pluralities of apertures can be spaced apart from one another by any desired distance. For example, the apertures can be spaced apart from one another by a distance of from about 0.5 mm to about 50 mm, from about 1.0 mm to about 10 mm, from about 2.5 mm to about 7.5 mm, or from about 3.0 mm to about 6.0 mm. The individual apertures of the first and second pluralities of apertures can have any desired diameter. For example, the individual apertures can each have a diameter of from about 0.001 inch to about 0.1 inch, from about 0.005 inch to about 0.05 inch, or from about 0.01 inch to about 0.025 inch. In some embodiments, the first plurality of apertures can each have a diameter of from about 0.005 inch to about 0.025 inch and the second plurality of apertures can each have a diameter of from about 0.030 inch to about 0.090 inch.

The substrate support of the film-forming apparatus can comprise a first region for supporting a substrate in a first position, and a second region for supporting a substrate in a second position. The apparatus can further comprise one or more substrate actuators configured to convey the substrate from the first position to the second position. The substrate support can have a length and the substrate actuator can comprise a linear motor disposed along a length of the substrate support. The first position can correspond to a first work station and the second position can correspond to a second work station. In some embodiments, a second linear motor can also be disposed along a length of the substrate support.

According to various embodiments of the present teachings, a method of forming a film on a substrate surface is provided. The method can comprise a plurality of steps, including a first step whereby film-forming material is loaded into microstructures of a thermal printing array. A substrate can be positioned above the thermal printing array such that a surface of the substrate faces down and is in close proximity to the thermal printing array for receiving material printed or transferred from the thermal printing array. The thermal printing array can be heated to thereby direct the film-forming material from the thermal printing array onto the face-down surface of the substrate. After receiving the film-forming material, the substrate can be moved away from the thermal printing array.

The loading, positioning, and heating steps of a thermal printing process can be repeated any desired number of times. The microstructures of the thermal printing array can be reloaded with the same film-forming material or with a different film-forming material. In some embodiments, the reloading comprises positioning one or more inkjet arrays in a first inkjet position adjacent the thermal printing array and then inkjetting the film-forming material from the inkjet array onto the microstructures of the thermal printing array. The inkjetted film-forming material can be in a liquid form, for example, as a solution or dispersion in a volatile vehicle. After reloading, the method can further comprise moving the inkjet array or from the first inkjet position to a second inkjet position where the inkjet array does not obstruct movement of the substrate and/or where the inkjet array can be reloaded or refilled. The second inkjet position can be inside or outside the process chamber in which substrate printing occurs. The thermal printing array can comprise a plurality of thermal printing print module packages and the inkjet array used can comprise a plurality of inkjet printheads.

In accordance with various embodiments of the present teachings, a method of forming a film on a surface of a substrate is provided that uses only inkjet printing. The substrate can be oriented or arranged in a first position above an upwardly-facing inkjet printing array that is set in a gas bearing plate system. The configuration is such that a printing surface of the substrate faces downwardly toward the inkjet printing array. The inkjet printing array can be activated to direct or fire a first film-forming material from the inkjet printing array onto the substrate surface. The substrate can then be positioned in a second position above the inkjet printing array. The inkjet printing array can then be activated to direct or fire a second film-forming material from the inkjet printing array onto the substrate surface. While the description above mentions positioning the substrate, it is to be understood that the printing array can instead or also be moved or positioned to achieve a relative positioning between the substrate and the printing array. Any method of the present teachings can further comprise the use of vacuum thermal evaporation (VTE), for example, to form one or more additional layers of an OLED.

Any number of different positions of the substrate relative to the inkjet printing array can be established. A position previously established can be later reestablished. Establishing a position can be carried out by any suitable mechanism. For example, positioning can comprise at least one of moving the inkjet array and moving the substrate. In some embodiments, the substrate is moved using at least one of the gas bearing system and a substrate holder operatively associated with a linear actuator. A computer or other processing system can be used to store, memorize, execute, modify, or otherwise manipulate or control the gas bearing system, substrate holder, and/or linear actuator.

Any number of different film-forming materials can be used for printing. The first and second film-forming materials can be identical or different. The same film-forming material can be applied to the substrate surface at different positions or different film-forming materials can be applied to substrate surfaces at different positions. In some embodiments, the inkjet printing print array comprises three columns of print module packages such that a first of the three columns of print modules packages is configured for printing at least one red ink, a second of the three columns of print module packages is configured for printing at least one green ink, and a third of the columns of print module packages is configured for printing at least one blue ink.

Methods of the present teachings can comprise cleaning a printing array using any suitable technique and/or mechanism. For example, the cleaning can be performed using at least one of a blotter and a vacuum chamber. The blotter can be applied to a printhead, nozzle, and or transfer surface to remove excess or residue ink. The blotter can be of any suitable form. For example, the blotter can comprise a squeegee or a cloth that can be spooled to continuously or on-demand make available a clean segment of cloth. A vacuum chamber can be used that is of any suitable form. In some embodiment, the vacuum chamber is equipped with a dedicated vacuum apparatus for application of a vacuum. In some embodiments, the vacuum chamber forms a close fit engagement with the gas bearing system and utilizes vacuum apertures comprised by the gas bearing system. The method can comprise a purge sequence during which existing ink is removed and a new ink is introduced to the print array, for example by pulling and/or pushing ink or other film-forming material from one or more nozzle. The cleaning can leave a nozzle plate clear of film-forming material. The cleaning can also remove air bubbles from the nozzle.

Positioning the substrate can comprise supporting the substrate on a substrate support using a gas bearing system. Any type of suitable substrate support can be used. For example, the substrate support can comprise a top surface and at least one opening in the top surface, and the printing array, or a print module package thereof, can be disposed in the at least one opening. The gas bearing system can comprise a first plurality of apertures in the top surface, and a second plurality of apertures in the top surface. A first plurality of gas channels can extend from the first plurality of apertures into the substrate support and communicate with a first manifold. The gas bearing system can also comprise a second plurality of gas channels extending from the second plurality of apertures into the substrate support and communicating with a second manifold. The first plurality of apertures and the second plurality of apertures can surround the at least one opening in the top surface, and with multiple openings, can surround each of the openings independently.

In some embodiments, the first manifold is in gaseous communication with a source of pressurized inert gas, and the second manifold is in gaseous communication with a vacuum source, or vice versa. The source of pressurized gas can be maintained or varied at a pressure or within a range of pressures, for example, at a pressure of from about 20 psig to about 200 psig, from about 30 psig to about 90 psig, or from about 50 psig to about 75 psig. The vacuum source can exert, maintain, or vary a vacuum, for example, to maintain a pressure or a pressure range of from about −1.0 psig to about −13.5 psig, from about −5.0 psig to about −13.0 psig, or from about −8.0 psig to about −10.0 psig.

In some embodiments, moving the substrate away from the printing array can comprise conveying the substrate from a first position to a different position and positioning the substrate above a second printing array such that the face-down surface of the substrate faces the second printing array. The second printing array can be activated to thereby direct a second film-forming material from the second printing array onto the face-down surface of the substrate. In some embodiments, the second film-forming material differs from the first film-forming material, and in other embodiments it is the same film-forming material. In some embodiments, the second printing array is a second inkjet printing array.

In some embodiments, the second printing array is a second thermal printing array, which can be heated to thereby direct a second film-forming material from the second thermal printing array onto the face-down surface of the substrate. The substrate can be positioned above the second printing array such that it is not positioned above the first printing array and the first printing array is unobstructed. When unobstructed, reloading of the microstructures of a first thermal printing array with the first film-forming material is facilitated. In some embodiments, the method further comprises positioning a second inkjet array above a second thermal printing array. The second film-forming material is inkjetted from the second inkjet array onto microstructures of the second thermal printing array.

In some embodiments, the positioning and moving of the substrate comprises gripping the substrate with one or more appendages connected to at least one linear motor. In some embodiments, a gas bearing system is used to contact the substrate with an actuator, for example, one or more rotating wheels extending upwardly from the top surface of the substrate support. Exemplary actuator and/or bearing systems that can be used include those described in U.S. Pat. No. 7,908,885 B2, which is incorporated herein in its entirety by reference.

The printing array can comprise any desired number of columns and rows of print module packages. In some embodiments, the array can comprise from one to ten columns of print module packages. In some embodiments, the printing array comprises three columns of print module packages. A first of the three columns of print modules packages can be configured for transferring or printing at least one red ink. A second of the three columns of print module packages can be configured for transferring or printing at least one green ink. A third of the columns of print module packages can be configured for transferring or printing at least one blue ink. The order, types, and numbers of color inks or other film-forming materials can be varied. Organic materials useful in forming emitting layers for organic light emitting devices can be used as the film-forming material or ink.

In accordance with the method of forming a film on a surface of a substrate, the microstructures of a thermal printing array can comprise a plurality of transfer surfaces. Any number of appropriate transfer surfaces can be used. An inkjet printing array can comprise a plurality of nozzles. Any number of appropriate nozzles can be used. The method can further comprise maintaining a desired distance between the plurality of transfer surfaces or nozzles and the face-down surface of the substrate by using at least one gas bearing. In some embodiments, the distance is from about 500 µm to about 3.0 mm, from about 50 µm to about 0.5 mm, from about 100 µm to about 250 µm, from about 15 µm to about 50 µm, or from about 20 µm to about 40 µm.

The gas bearing system can utilize any gas or mixture of gasses. The gas bearing system can use the same or a different gas as a gas contained in the process chamber or in an encompassing gas enclosure system. In some embodiments, gas bearings are implemented that use an inert gas, for example, nitrogen gas, one or more noble gasses, or a combination thereof. Gas bearing systems, as well as related methods and systems available from New Way Machine Components, Inc. of Aston, Pa., can be used as, or in combination with, the gas bearing systems described in the present teachings. Devices, systems, methods, and applications relating to gas bearing systems and that can be used in connection with the present teachings include, for example, those described in U.S. Pat. No. 7,908,885 B2, which is incorporated herein in its entirety by reference. Gas bearing systems, as well as related methods and systems available from Coreflow Scientific Solutions LTD. of Yoqneam, Israel can be used as, or in combination with, the gas bearing systems described in the present teachings. Gas bearings in the form of guide ways can also be used. For example, an ultra-precision gantry featuring air bearing guide ways, available from Anorad Corporation of Shirley, N.Y., can be used. Other exemplary devices, systems, methods, and applications relating to gas bearing systems that can be used in connection with the present teachings include, for example, those described in U.S. Pat. No. 7,883,832 B2, U.S. Pat. No. 7,857,121 B2, U.S. Pat. No. 7,604,439 B2, U.S. Pat. No. 7,603,028 B2, and U.S. Pat. No. 7,530,778 B2, in U.S. Patent Application Publication No. US 2009/0031579 A1, and in U.S. Patent Application No. 61/521,604, which are incorporated herein in their entireties by reference.

In some embodiments, the present teachings relate to apparatuses and methods for printing one or more film-forming materials onto a substrate by using a printing apparatus and printing on a surface of the substrate that is facing downwardly. The printing apparatus can thus print from a position below or underneath the substrate. Suitable thermal printing apparatuses that can be used include those described, for example, in U.S. Patent Application Publications Nos. US 2008/0311307 A1, US 2008/0308037 A1, US 2006/0115585 A1, US 2010/0188457 A1, US 2011/0008541 A1, US 2010/0171780 A1, and US 2010/0201749 A1, which are incorporated herein in their entireties by reference. Any suitable inkjet printing apparatus can be used. For example, an inkjet printing apparatus can comprise a SAMBA printhead module (FUJIFILM Dimatix, Inc., Santa Clara, Calif.).

Regarding film materials, generally, and according to various embodiments, the film material can be delivered to a printing array in the form of a solid ink, liquid ink, or gaseous vapor ink comprised of pure film material or film material and non-film (carrier) material. Formulations that comprise inks can be used as they provide the film-forming material to the printing array along with one or more non-film-forming materials. The non-film-forming materials can comprise, for example, a vehicle, carrier, and/or solvent that can facilitate handling of the film-forming material prior to deposition onto the substrate. The film-forming material can comprise an OLED material. The film material can comprise a mixture of multiple materials. The carrier material can comprise one or more materials, for example, the carrier can comprise a mixture of materials. An example of a liquid ink is one that comprises a film-forming material dissolved or suspended in a carrier fluid or liquid. Another example of a liquid ink is pure film-forming material in a liquid phase, for example, film-forming material that is maintained at an elevated temperature so that the film-forming material forms a liquid melt. An example of a solid ink is one that comprises solid particles of film-forming material. Another example of a solid ink is a film-forming material dispersed in a carrier solid. An example of a gas vapor ink is vaporized film-forming material. Another example of a gaseous vapor ink is vaporized film-forming material dispersed in a carrier gas.

The ink can deposit on the thermal printing array as a liquid or a solid, and such phase can be the same or different than the phase of the ink during delivery. In one example, the film-forming material can be delivered as gaseous vapor ink yet is deposited on the thermal printing array in a solid phase. In another example, the film-forming material can be delivered as a liquid ink and deposited on the thermal printing array in the liquid phase. The ink can deposit on the thermal printing array in such a way that only the film-forming material deposits and the carrier material does not deposit or evaporates upon or just after deposition. The ink can also deposit in such a way that the film-forming material, as well as one or more vehicle materials, deposits on the thermal printing array.

In some embodiments, the film-forming material can be delivered as a gaseous vapor ink comprising both vaporized film-forming material and a carrier gas, and only the film-forming material deposits on the thermal printing array. In some embodiments, the film-forming material can be delivered as a liquid ink comprising film-forming material and a carrier fluid, and both the film-forming material and the carrier fluid deposit on the thermal printing array or directly on the substrate. In various embodiments, the film-forming material delivery mechanism can deliver the film-forming material onto the thermal printing array or the substrate in a prescribed pattern. The delivery of film-forming material can be performed with material contact or without material contact between the thermal printing array and the delivery mechanism, or between the inkjet printing array and the substrate.

In regions of the conveyor away from the printing devices, it can be sufficient to employ pressure only (for example, nitrogen gas under pressure) for supporting the substrate. In the region proximate the thermal printing devices it can be advantageous to employ both pressure (for example, nitrogen gas under pressure) and vacuum for fine support of the substrate. Generally, the flying height over, or proximate, the printing arrays is at or near 25 μm (+/−5.0 μm). Elsewhere, or in regions away from the printing arrays, the flying height can be within a range, for example, of from about 2.5 μm to about 2.5 mm, from about 5.0 μm to about 500 μm, from about 10 μm to about 300 μm, or from about 25 μm to about 250 μm. The speed of the linear motor can be, for example, from about 25 mm/s to about 5.0 m/s, from about 50 mm/s to about 1.0 cm/s, from about 100 mm/s to about 500 mm/s, or about 300 mm/s. In various embodiments, the speed is 2.5 m/s and an acceleration of 5.0 m/s$^2$ is not exceeded.

Regarding process timing, the consecutive firing of the printing device can be spaced apart at, for example, from about 0.050 second to about 30 seconds, from about 0.10 second to about 15 seconds, from about 1.0 second to about 10 seconds, from about 1.5 seconds to about 5.0 seconds, or about 2.0 seconds. Simultaneously with firing a first thermal printing array, the same or a different inkjet array that deposited ink on the first thermal printing array can deposit ink onto a second thermal printing array, and if not simultaneously, within one or two seconds. Substrate movement from one printing array to the next can take, for example, less than one second or from about one second to about ten seconds. The substrate is typically stationary during the period of activating a printing array to effect transfer of the film-forming material.

With reference now to the drawings, FIG. 1A is a plan view of a process chamber 20 in accordance with various embodiments of the present teachings. Process chamber 20 can comprise a housing 22 and housing 22 can comprise a sidewall 24 and a base 25. Sidewall 24 can comprise a first lateral end 26, a second lateral end 28, a first transverse side 30, and a second transverse side 32. Process chamber 20 can further comprise a ceiling such as transparent ceiling 33. First lateral end 26 can comprise a first door valve 34 and second lateral end 28 can comprise a second door valve 36. Door valve 34 and 36 can provide shutter style sealable openings to transfer new and printed substrates into and out of process chamber 20.

Process chamber 20 can comprise a chamber interior 38. A first substrate 40 can reside within chamber interior 38. A second substrate 42 can be positioned outside of chamber interior 38 and separated from interior 38 by door valve 34. Chamber interior 38 can comprise a first lateral region 44 extending from first lateral end 26 toward second lateral end 28. Chamber interior 38 can comprise a second lateral region 46 extending from second lateral end 28 toward first lateral end 26. Chamber interior 38 can further comprise an intermediate region 48 situated between first lateral region 44 and second lateral region 46. Intermediate region 48 can define ends of regions 44 and 46. First lateral region 44 can comprise a first lateral gas bearing system 50 and a second lateral gas bearing system 52 in base 25. Second lateral region 46 can comprise a third lateral gas bearing system 54 and a fourth lateral gas bearing system 56 in base 25. Intermediate region 48 can comprise an intermediate gas bearing system 58 in base 25. A printing array 60 can be mounted in base 25 within intermediate gas bearing system 58. Printing array 60 can comprise an inkjet and/or thermal printing array. Printing array 60 can comprise a first print module package column 62 and a second print module package column 64. In embodiments in which printing array 60 comprises a thermal printing array, an inkjet array 66 comprising a plurality of ink printheads 68 can be operably associated with process chamber 20 and in some cases can be configured or actuated to move into and out of process chamber 20.

First substrate 40 can be moved within chamber interior 38 using a substrate actuator 70. Substrate actuator 70 can comprise an actuator track 72, an actuator trolley 74, and a substrate holder 76. Actuator trolley 74 is configured to ride on actuator track 72. Substrate holder 76 is connected to trolley 74 and configured to hold, for example, first substrate 40. Substrate holder 76 can comprise, for example, a vacuum chuck, a set of gripping jaws, suction cups, clamps, or a combination thereof. In embodiments in which printing array 60 comprises a thermal printing array, a dedicated inkjet array actuator can also be provided. An inkjet array actuator can serve to move inkjet array 66 into and out of chamber interior 38. In FIG. 1A, inkjet array 66 is positioned outside of chamber interior 38 and first substrate 40 is positioned in second lateral region 46. When printing array 60 comprises an inkjet printing array, inkjet array 66 can be omitted from the system.

FIG. 1B is a plan view of the system and process chamber 20 shown in FIG. 1A but wherein inkjet array 66 is within chamber interior 38 and positioned over thermal printing array 60 so as to apply ink to printing array 60. First substrate 40 remains in second lateral region 46, for example, remaining attached to substrate actuator 70. Inkjet array 66 is within intermediate region 48. While the plurality of ink printheads 68 of inkjet array 66 are applying ink to first print module package column 62 and second print module package column 64, inkjet array 66 can ride on intermediate gas bearing system 58 or can be manipulated by a separate, different positioning system that may or may not include a gas bearing. In some embodiments, a robotic assembly is used to position inkjet array 66 with respect to printing array 60.

Figure 1C:
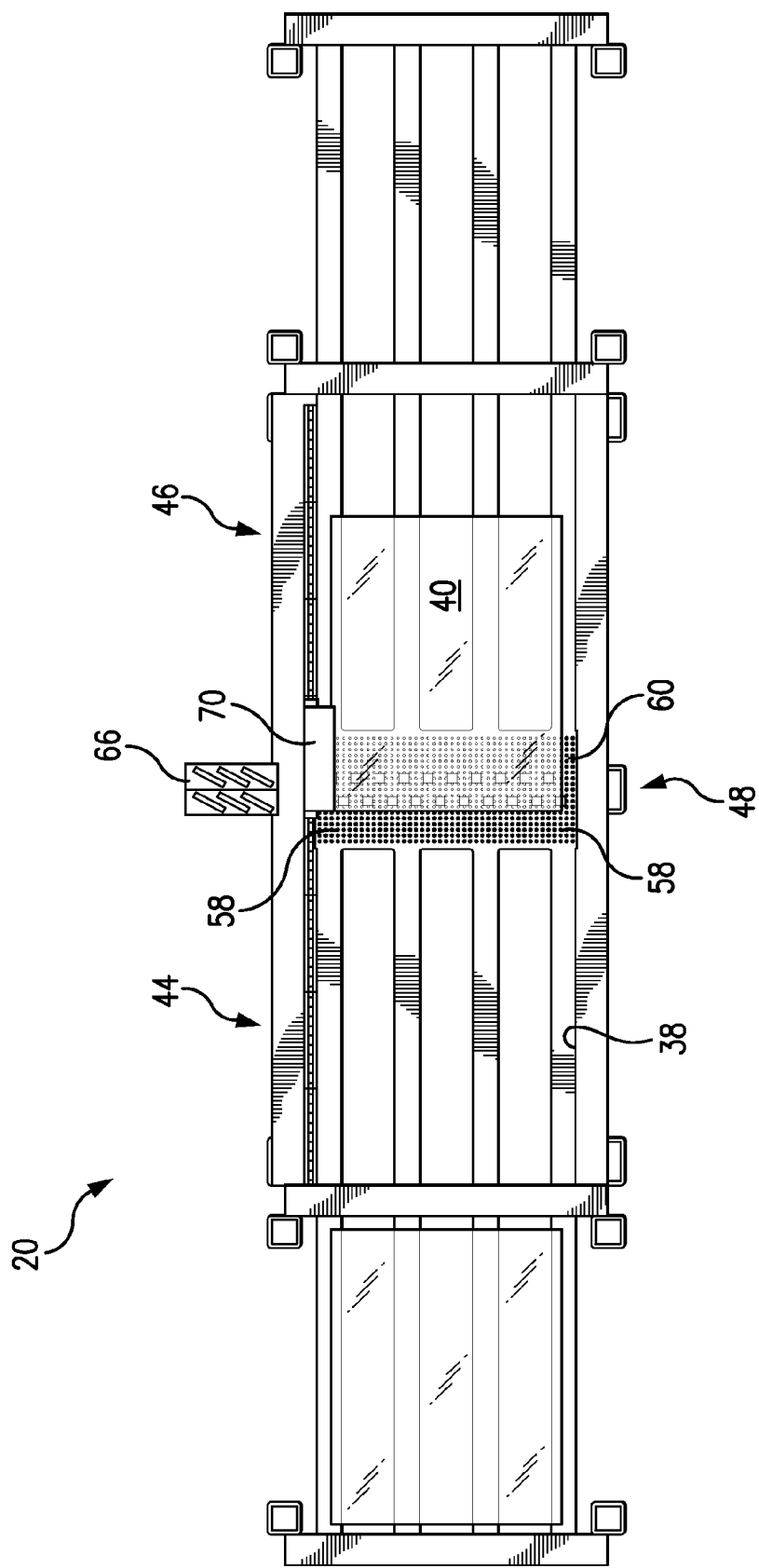
FIG. 1C is a plan view of a configuration of the system shown in FIG. 1A after the thermal printing array has been loaded and showing the substrate positioned to receive film-forming material from the thermal printing array.

FIG. 1C is a plan view of the system and process chamber 20 shown in FIG. 1A but wherein inkjet array 66 is again outside of chamber interior 38. First lateral region 44 is empty, however, in the configuration of FIG. 1C, first substrate 40 resides above printing array 60 and intermediate gas bearing system 58 within intermediate region 48. As substrate printing progresses, part of first substrate 40 would then be positioned within second lateral region 46. Movement of first substrate 40 is provided, at least in part, by substrate actuator 70.

Figure 1D:
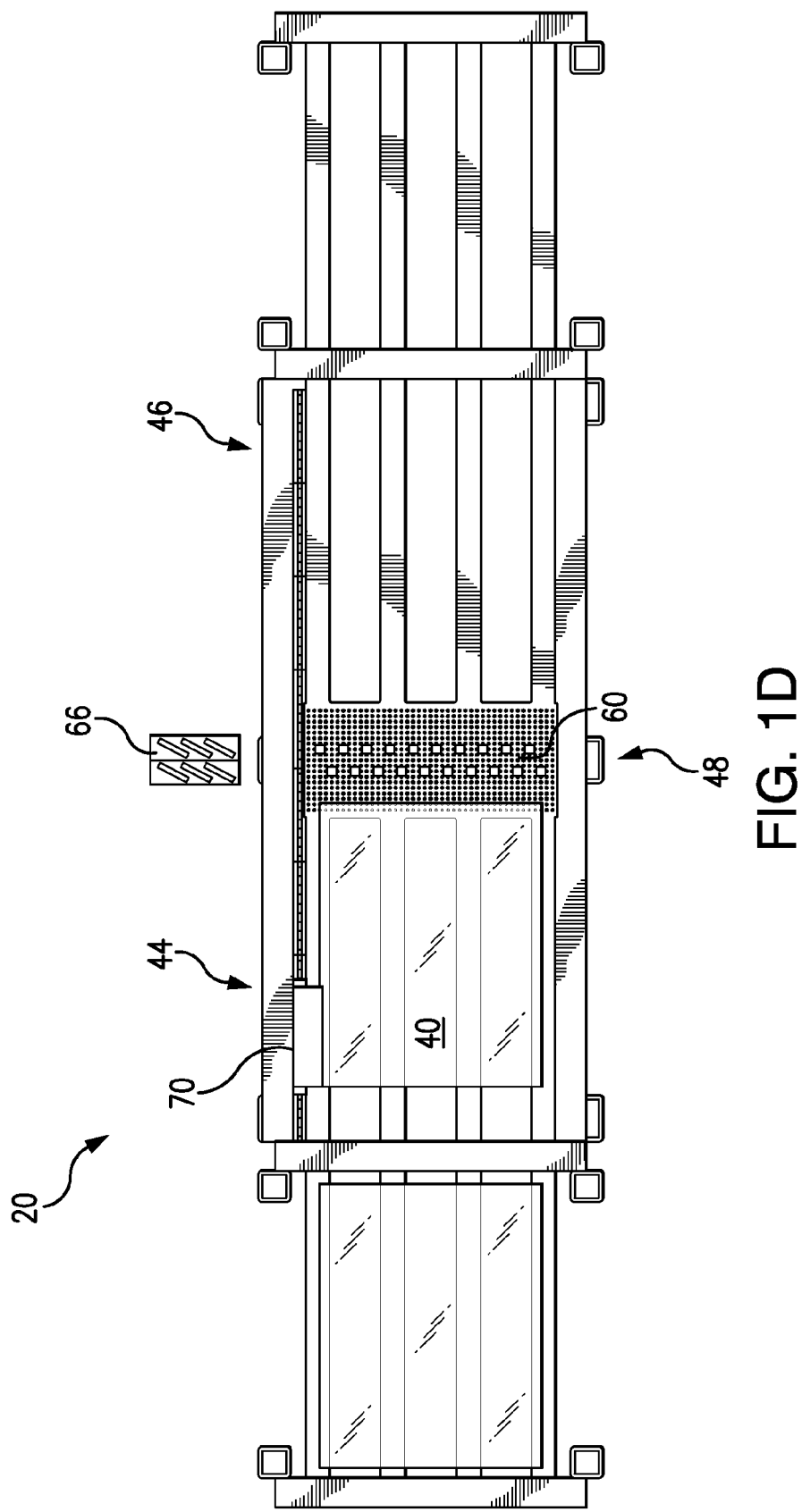
FIG. 1D is a plan view of a configuration of the system shown in FIG. 1A after the substrate has completely passed over and cleared the thermal printing array and wherein the thermal printing array is exposed and available to be re-loaded with film-forming material.

FIG. 1D is a plan view of the system and process chamber 20 as shown in FIG. 1A but wherein inkjet array 66 remains outside of chamber interior 38 and first substrate 40 has been moved by substrate actuator 70 into first lateral region 44. Printing array 60 within intermediate region 48 is now uncovered by first substrate 40 and unobstructed. In the position shown, inkjet array 66 can now reload printing array 60 with more film-forming material that can be deposited on substrate 40 as substrate 40 moves from region 44 back to region 46.

Figure 1E:
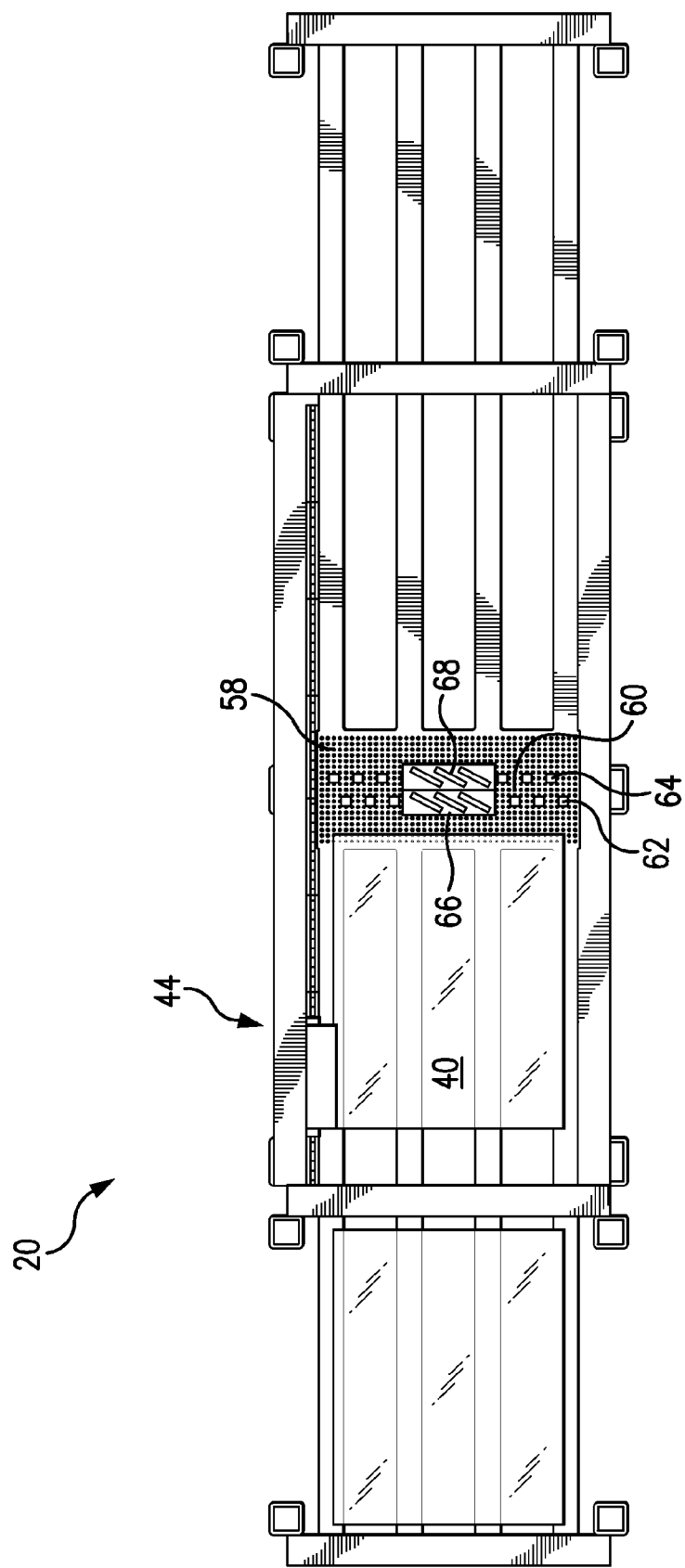
FIG. 1E is a plan view of a configuration of the system shown in FIG. 1A wherein the inkjet array is again positioned to load film-forming material onto the thermal printing array.

FIG. 1E is a plan view of the system and process chamber 20 shown in FIG. 1A but wherein first substrate 40 remains in first lateral region 44 and inkjet array 66 has re-entered chamber interior 38 and is positioned over printing array 60. Inkjet array 66 rides on intermediate gas bearing 58 over printing array 60 and applies further material or ink to first print module package column 62 and second print module package column 64.

In various embodiments, for example, as depicted in FIG. 1A, substrate 40 (for example, comprising glass) enters process chamber 20. Process chamber 20 can comprise, for example, a controlled environment comprising atmospheric pressure, or somewhat higher than atmospheric pressure, and one or more inert gasses (for example, nitrogen gas). The inert atmosphere can be substantially free of oxygen gas, dihydrogen oxide, and other reactive gasses, for example, containing less than 100 ppm, less than 10 ppm, less than 1.0 ppm, or less than 0.1 ppm of such compounds. Substrate 40 can be conveyed and supported by, for example, a non-contact gas bearing conveyor and support apparatus. Embodiments of a non-contact porous air bearing and glass flattening device are taught in U.S. Pat. No. 7,908,885 B2, which is incorporated herein in its entirety by reference.

As shown in FIG. 1B, inkjet array 66 has moved from the retracted position shown in FIG. 1A and is shown traversing the substrate support and deposits ink on printing array 60 with one pass in each direction. As shown in FIG. 1C, a linear motor (substrate actuator 70) of the conveyor/support apparatus positions substrate 40 over printing array 60. During movement of the substrate, solvent of the ink formulation evaporates, leaving substantially solid film-forming material in microstructures (for example, pores or channels) of a thermal printing array. Substrate 40 can be positioned with its surface to be printed facing downwardly, above printing array 60, at which location the print module packages can be activated. In embodiments using thermal printing arrays, sublimation and/or evaporation causes the film-forming material (for example, an OLED material) to condense upon substrate 40, thereby forming a film on the substrate.

As can be seen in FIG. 1D, substrate 40 is moved to a position enabling inkjet array 66 to deposit more ink on printing array 60. As shown in FIG. 1E, the inkjet inking process can be repeated. The inking process can be repeated after each activation of printing array 60, with substrate 40 being moved out of the way. Substrate 40 can be moved back and forth over printing array 60, each time repositioning substrate 40 to an area that has not previously been printed by printing array 60.

Through carrying out the sequence of steps depicted in FIGS. 1A-1E a substrate can be made to receive one or more films or layers of film-forming material while causing little movement of the substrate. The sequence of steps enables simultaneous material transfer onto the substrate and reloading of a thermal printing array.

Figure 2A:
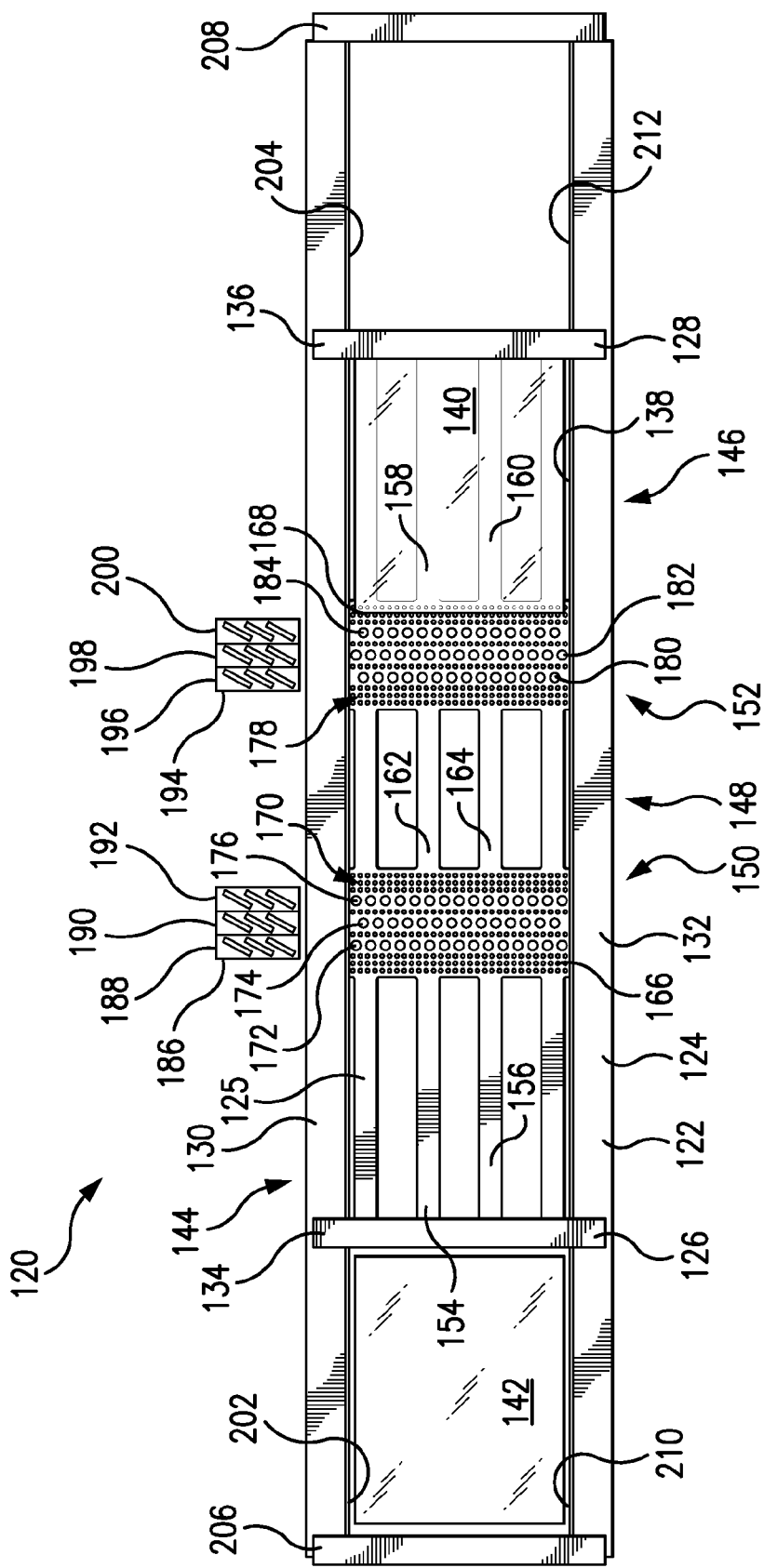
FIG. 2A is a plan view of a system and process chamber in accordance with other various embodiments of the present teachings.

FIG. 2A is a plan view of a system including a process chamber 120 in accordance with various embodiments of the present teachings. Process chamber 120 comprises a housing 122 which in turn comprises a sidewall 124 and a base 125. Sidewall 124 can comprise a first lateral end 126, a second lateral end 128, a first transverse side 130, and a second transverse side 132. Process chamber 120 can further comprise a ceiling (not shown) or can be completely enclosed, with the exception of the load-lock chambers described below. Process chamber 120 can be enclosed, for example, in an inert gas enclosure and environment control system. First lateral end 126 can comprise a first door valve 134 and second lateral end 128 can comprise a second door valve 136. Process chamber 120 can comprise a chamber interior 138. Chamber interior 138 can contain a first substrate 140 while a second substrate 142 resides outside chamber interior 138. A first lateral region 144 can extend from first lateral end 126 towards second lateral end 128. A second lateral region 146 can extend from second lateral end 128 toward first lateral end 126. A central region 148 can reside between a first intermediate region 150 and a second intermediate region 152. First intermediate region 150 and second intermediate region 152 can be adjacent and partial define first lateral region 144 and second lateral region 146, respectively. First lateral gas bearing system 154 and second lateral gas bearing system 156 can reside in base 125 within first lateral region 144. Third lateral gas bearing system 158 and fourth lateral gas bearing system 160 can reside in base 125 within second lateral region 146. First central gas bearing system 162 and second central gas bearing system 164 can reside in base 125 within central region 148. First intermediate gas bearing system 166 can reside in base 125 within first intermediate region 150. Second intermediate gas bearing system 168 can reside in second intermediate region 152.

A first printing array 170, which can comprise an inkjet printing array and/or thermal printing array, can reside in base 125 and be surrounded by first intermediate gas bearing system 166. First printing array 170 can comprise a first print module package column 172, a second print module package column 174, and a third print module package column 176. Second printing array 178, which can comprise an inkjet printing array and/or thermal printing array, can reside in base 125 and be surrounded by second intermediate gas bearing system 168. Second printing array 178 can comprise a fourth print module package column 180, a fifth print module package column 182, and a sixth print module package column 184. In embodiments using a thermal printing array, a first inkjet array 186 can reside outside of chamber interior 138, adjacent and aligned with first printing array 170. First inkjet array 186 can comprise a first inkjet printhead column 188, a second inkjet printhead column 190, and a third inkjet printhead column 192. A second inkjet array 194 can be positioned outside of chamber interior 138, adjacent and aligned with second printing array 178. Second inkjet array 194 can comprise a fourth inkjet printhead column 196, a fifth inkjet printhead column 198, and a sixth inkjet printhead column 200.

A first load-lock chamber 202 can be positioned alongside and in operative communication with process chamber 120 at first lateral end 126. A second load-lock chamber 204 can be positioned alongside process chamber 120 in operative communication therewith at second lateral end 128. First load-lock chamber 202 can comprise a third door valve 206 and second load-lock chamber 204 can comprise a fourth door valve 208. First load-lock chamber 202 can comprise a first load-lock chamber interior 210 and second load-lock chamber 204 can comprise a second load-lock chamber interior 212. In FIG. 2A, second substrate 142 is received in first load-lock chamber interior 210. First substrate 140 resides in second lateral region 146. First inkjet array 186 and second inkjet array 194 are both outside of chamber interior 138. Printing arrays 170 and 178 are unobstructed and can be loaded with film-forming material by inkjet arrays 186 and 194, respectively.

Figure 2B:
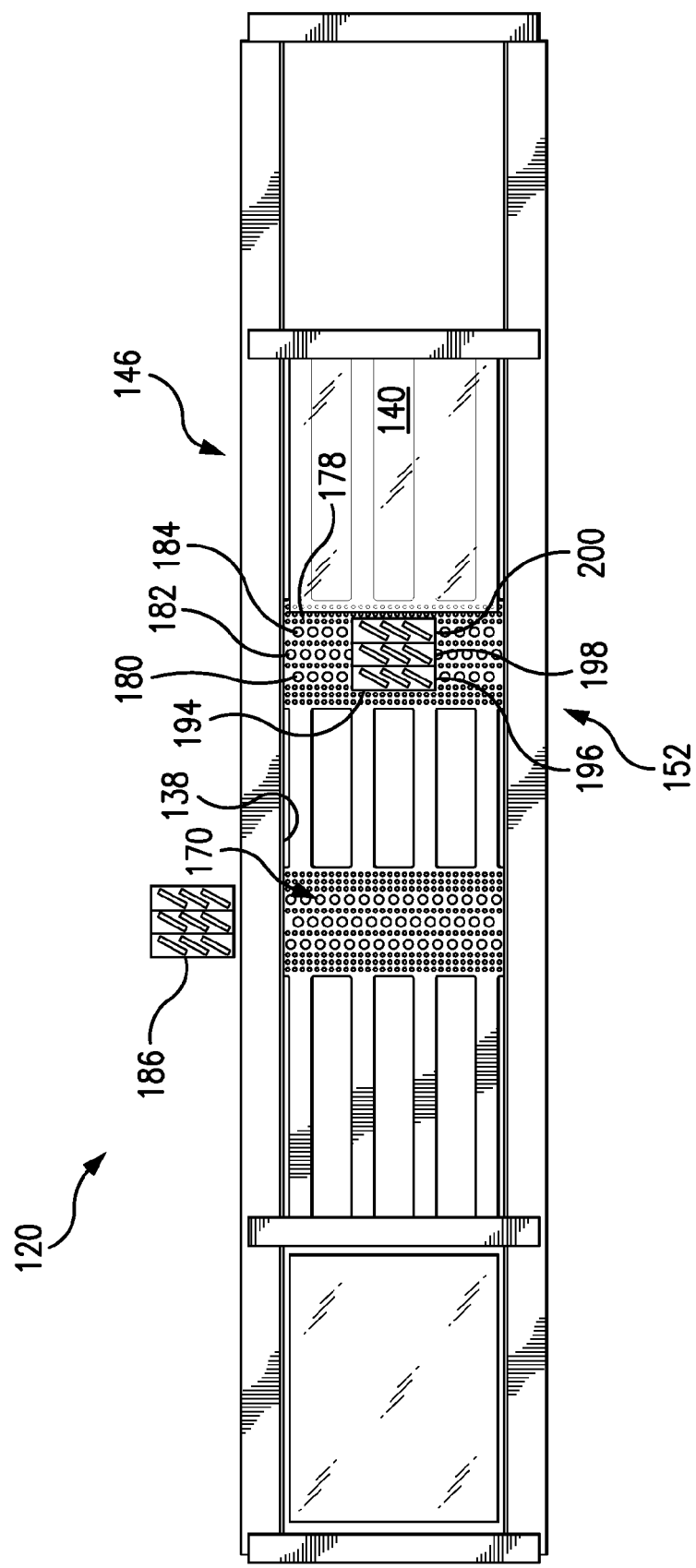
FIG. 2B is a plan view of a configuration of the system shown in FIG. 2A wherein a first inkjet array remains spaced from a first thermal printing array and in a retracted position while a second inkjet array loads a second thermal printing array.

FIG. 2B is a plan view of the system and process chamber 120 shown in FIG. 2A but wherein second inkjet array 194 has entered chamber interior 138 and is in position to load second printing array 178. In FIG. 2B, first inkjet array 186 remains outside of chamber interior 138. Ink or other material can be applied respectively from fourth inkjet printhead column 196 to fourth print module package column 180, from fifth inkjet printhead column 198 to fifth print module package column 182, and from sixth inkjet printhead column 200 to sixth print module package column 184. While second inkjet array 194 is in second intermediate region 152, substrate 140 can reside in second lateral region 146. Simultaneously, or soon before or after, inkjet array 186 can be filled with a film-forming material to load printing array 170.

Figure 2C:
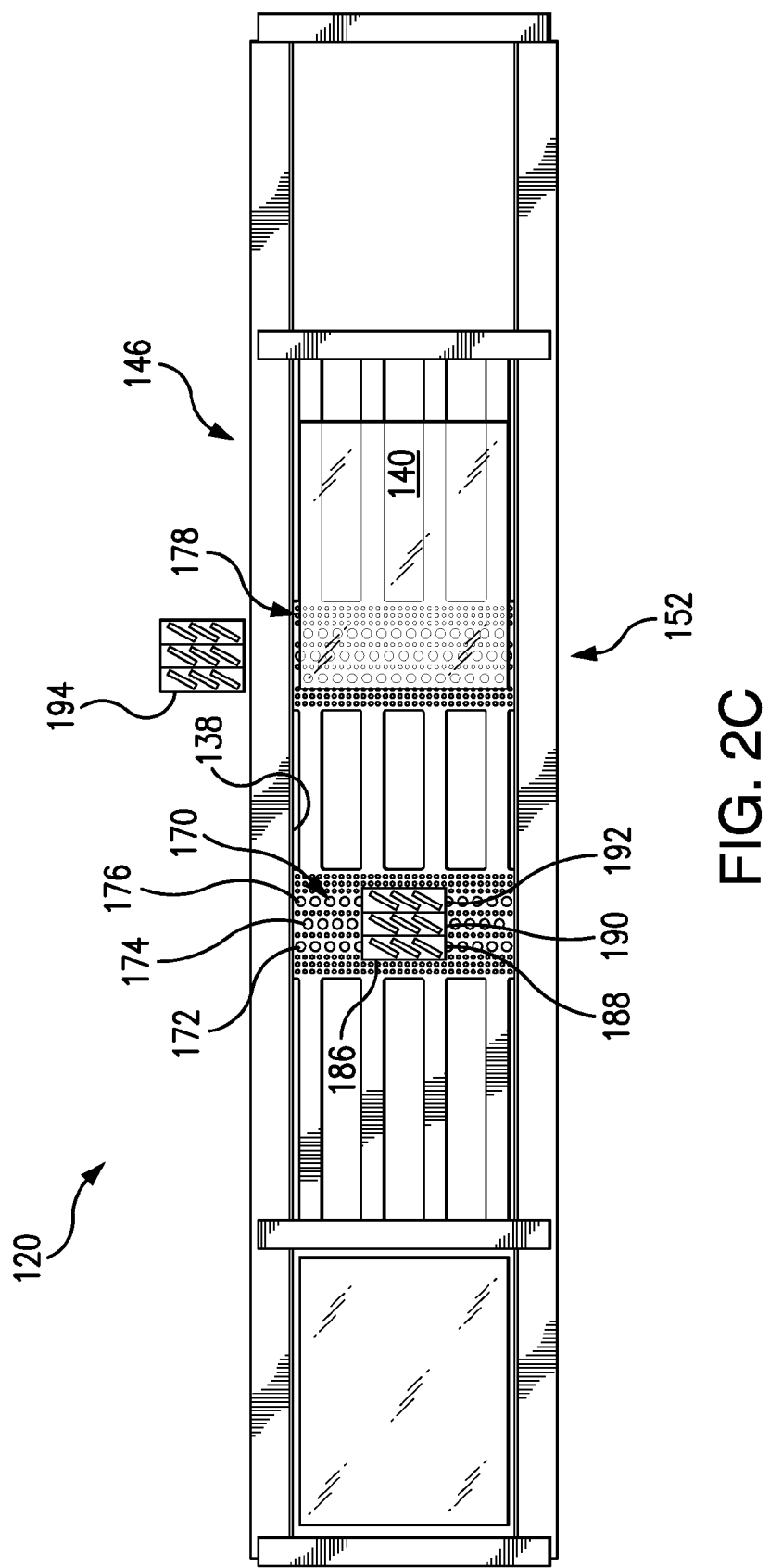
FIG. 2C is a plan view of a configuration of the system shown in FIG. 2A wherein the first inkjet array is positioned to load the first thermal printing array at the same time the second thermal printing array prints a film-forming material on a substrate and the second inkjet array is retracted.

FIG. 2C is a plan view of a configuration of the system and process chamber 120 shown in FIG. 2A but wherein first inkjet array 186 is within chamber interior 138 and second inkjet array 194 is outside of chamber interior 138. Substrate 140 is positioned over second printing array 178 to enable printing to occur, for example, solid transfer of material to the underside surface of first substrate 140. Substrate 140 is also positioned within second intermediate region 152 and second lateral region 146. While printing takes place onto substrate 140, first inkjet array 186 is positioned above first printing array 170 to transfer ink thereto. With this positioning, ink can be transferred from first inkjet printhead column 188 to first print module package column 172, from second inkjet printhead column 190 to second print module package column 174, and from third inkjet printhead column 192 to third print module package column 176.

Figure 2D:
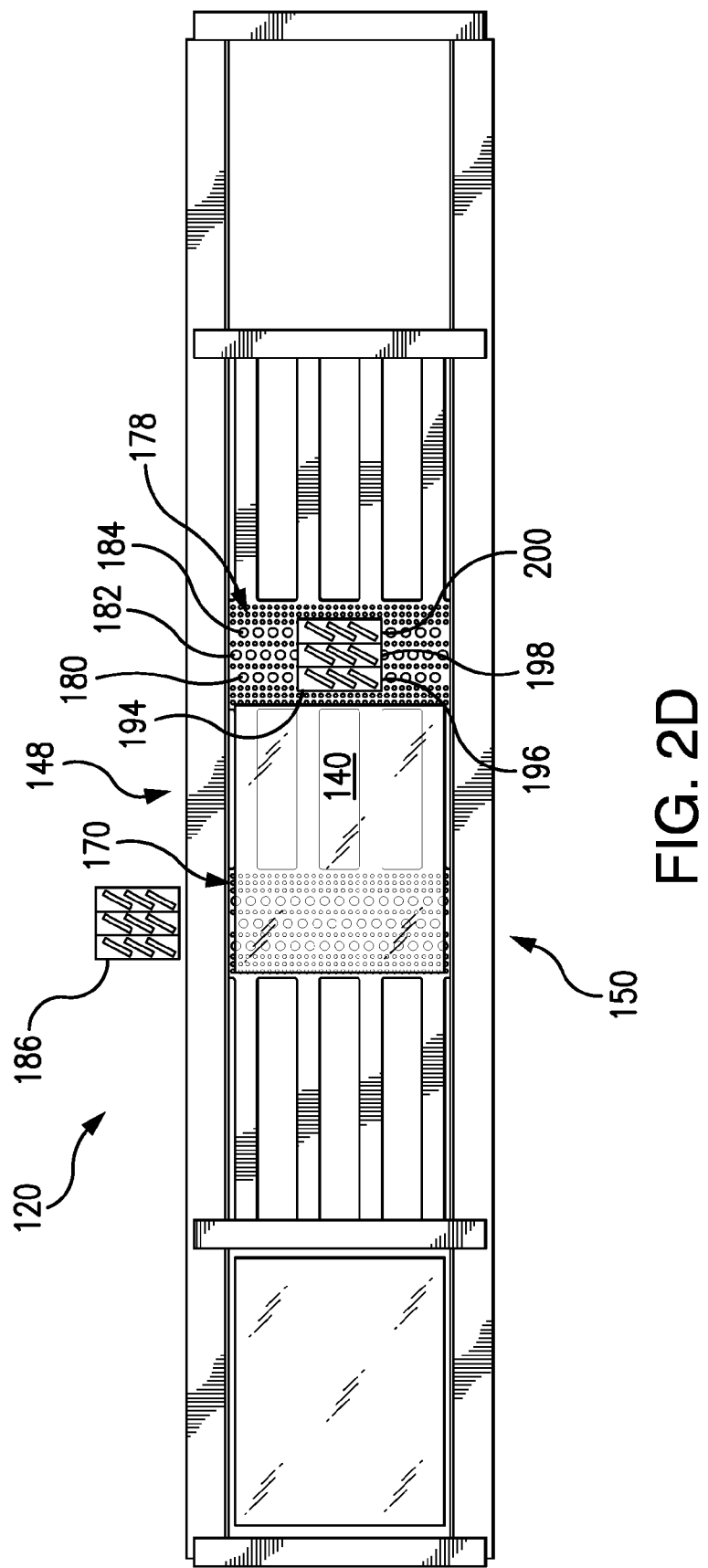
FIG. 2D is a plan view of a configuration of the system shown in FIG. 2A wherein the first inkjet array is retracted and the second inkjet array loads the second thermal printing array at the same time the first thermal printing array transfers film-forming material to the substrate.

FIG. 2D is a plan view of a configuration of the system and process chamber 120 as shown in FIG. 2D but wherein first inkjet array 186 has moved to outside of chamber interior 138 and second inkjet array 194 has returned to chamber interior 138. First substrate 140 is positioned within first intermediate region 150 and central region 148 such that first substrate 140 is now above first printing array 170. This positioning enables printing to occur from first printing array 170 onto the underside surface of first substrate 140. While printing occurs from first printing array 170 to first substrate 140, second inkjet array 194 is positioned above otherwise obstructed second printing array 178 to enable re-inking of second printing array 178. Again, fourth inkjet printhead column 196 is positioned for transfer of ink to fourth print module package column 180, fifth inkjet printhead column 198 is positioned for transfer of ink to fifth print module package column 182, and sixth inkjet printhead column 200 is positioned above sixth print module package column 184.

Various embodiments, for example, as depicted in FIGS. 2A-2D, enable a three color (for example, red (R), green (G), blue (B)), dual array arrangement. With reference to FIG. 2A, a substrate 140 (for example, glass) enters process chamber 120. Process chamber 120 can comprise, for example, a controlled environment comprising atmospheric pressure, or somewhat higher than atmospheric pressure, and one or more inert gasses (for example, nitrogen gas). Substrate 140 can be conveyed and supported by, for example, a non-contact gas bearing conveyor and support apparatus. Embodiments of a non-contact porous air bearing and glass flattening device are taught in U.S. Pat. No. 7,908,885 B2.

As shown in FIG. 2B, second inkjet array 194 deposits ink on second printing array 178 with one pass in each direction, particularly, one row of each of red, green, and blue. FIG. 2C depicts the just-loaded second printing array firing film-forming material onto substrate 140 simultaneously with a first inkjet array depositing red, green, and blue ink onto a respective first thermal printing array. Prior to firing of second printing array 178, during movement of substrate 140, solvent of the ink formulation evaporates, leaving substantially solid film-forming material in the microstructures (for example, pores or channels) of the print module packages within second printing array 178. Substrate 140 is positioned, with its surface to be printed upon, facing downwardly, above printing array 178, and, while first printing array 170 is loaded with ink, the print module packages of second printing array 178 are actuated and fired. Sublimation and/or evaporation causes the film-forming material (for example, OLED material) to condense upon substrate 140, thereby forming a film on substrate 140.

As shown in FIG. 2D, the first printing array 170 deposits film-forming material on the downward-facing surface of substrate 140 simultaneously with reloading of the second printing array 178 with ink by the second inkjet array 194. The process steps of FIGS. 2B, 2C, and 2D can be repeated until each square inch of the substrate is covered by one square inch of film material deposited by the printing arrays. In various embodiments, an outer-perimeter region can be free of deposits and reserved for substrate gripping and handling.

FIG. 3 is a plan view of a substrate printing configuration 220 in which a substrate 222 is positioned between a first printing array 224 and a second printing array 226. The double-headed arrow shows that substrate 222 can be moved from a central position to over either first printing array 224 or second printing array 226. One array can print while the other can be loaded or re-loaded.

FIG. 4 is a plan view of a substrate printing configuration 240. Substrate 242 is positioned to the left of a printing array 244. Dotted lines show the positioning that substrate 242 can take when it is passed over and moved to the right side of printing array 244. The double-headed arrow shows that substrate 242 can move to either side of, and clear, printing array 244.

FIG. 5 is a plan view of a substrate printing configuration 260 wherein a substrate 262 is positioned above a first printing array 264 and to the immediate left of a second printing array 266. Dotted lines show the right edge of first printing array 264 when covered by substrate 262. An arrow shows that substrate 262 can move to be over either first printing array 264 or second printing array 266 while clearing the other. In some embodiments, substrate printing configuration 260 represents a more efficient printing system than either substrate printing configuration 220 or 240 because first printing array 264 and second printing array 266 are close together and the spacing minimizes movement of substrate 262, although they are not so close together that one array would be prevented from being re-loaded while the other is firing.

Figure 6:
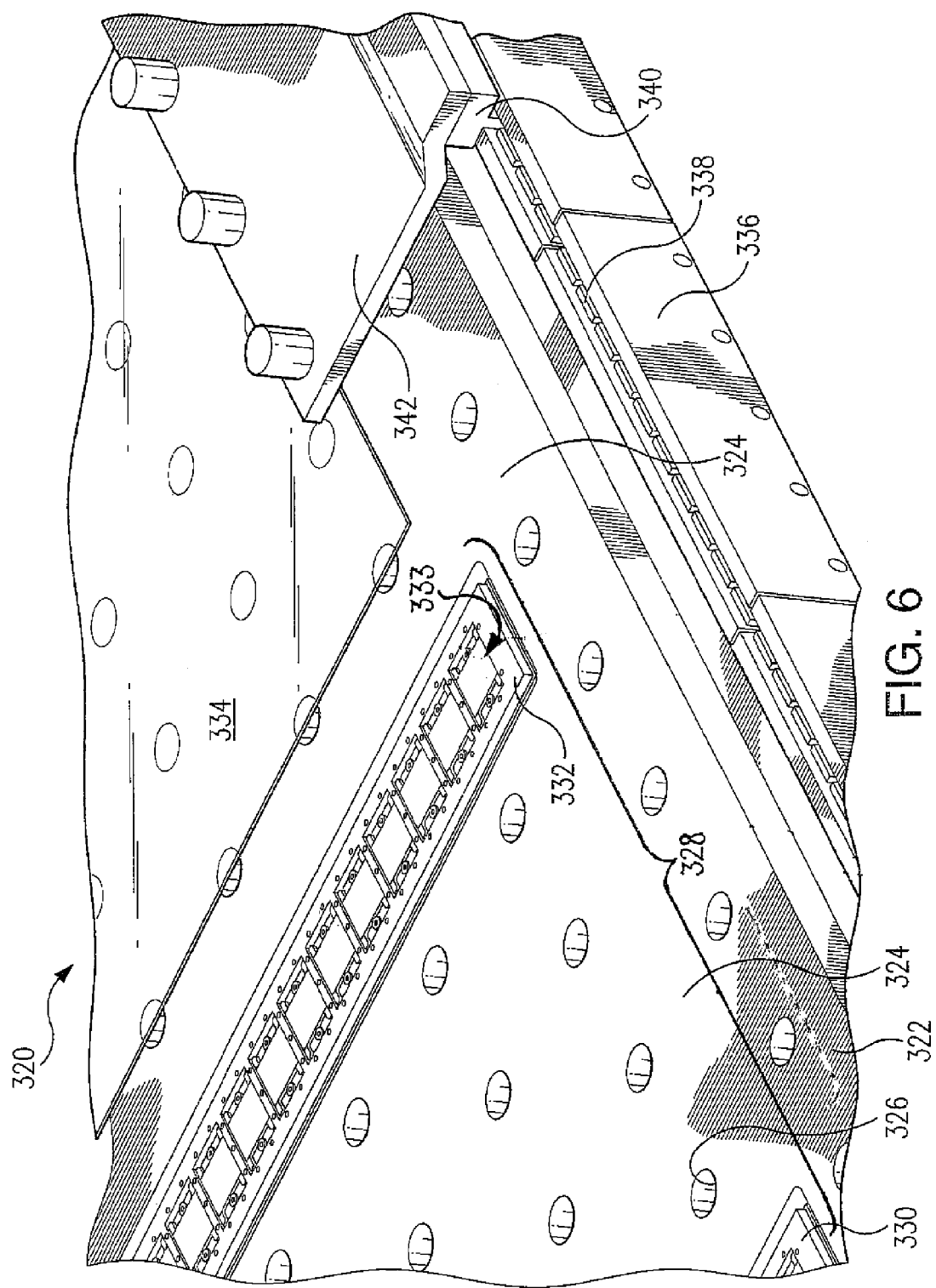
FIG. 6 is a perspective view of a printing system and substrate manipulating system in accordance with various embodiments of the present teachings.

FIG. 6 is a perspective view of a substrate printing configuration 320. Substrate printing configuration 320 comprises an interior base plate 322 and an integrated intermediate gas bearing system 324. Intermediate gas bearing system 324 comprises a plurality of apertures 326. A printing array 328 is positioned within intermediate gas bearing system 324. Printing array 328 can comprise a first print module package column 330 and a second print module package column 332. A plurality of print module packages 333 is received within second print module package column 332. Substrate 334 is attached to a substrate actuator 336 enabling movement of substrate 334 over interior base plate 322. Substrate actuator 336 comprises a substrate actuator track 338, a substrate actuator trolley 340, and a substrate chuck or holder 342. A motor and drive unit (not shown) can be provided to translate substrate actuator trolley 340 along substrate actuator track 338. Although thermal print module packages are shown in FIG. 6, inkjet print module packages can be used in addition or in the alternative to thermal print module packages.

Figure 7:
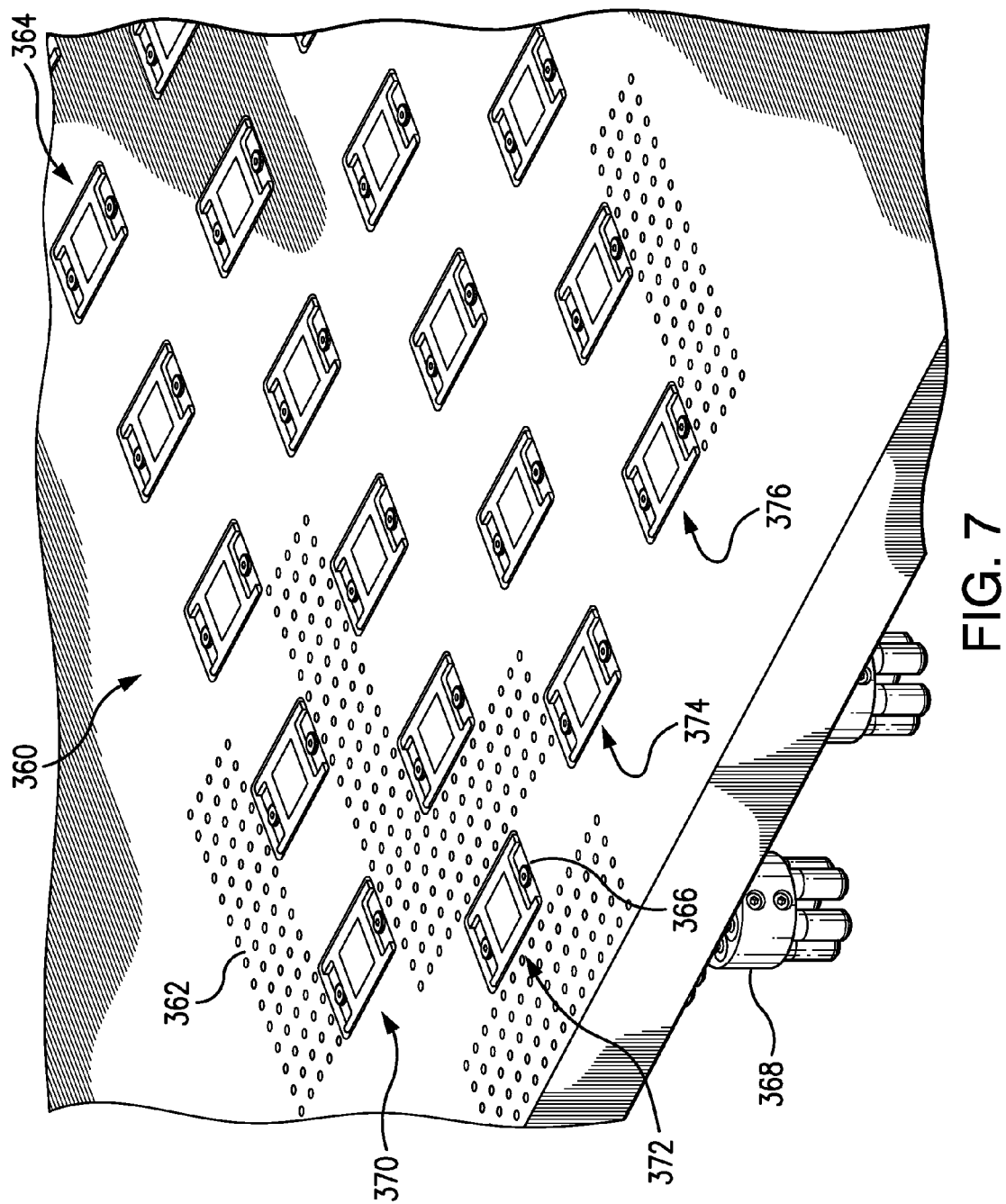
FIG. 7 is a perspective view of a substrate support and printing system, including a thermal printing array layout, in accordance with various embodiments of the present teachings.

FIG. 7 is a perspective view of a substrate printing system 360 comprising a gas bearing system 362. Integrated within gas bearing system 362 is a printing array 364. Printing array 364 comprises a plurality of print module packages 366. Each print module package 366 is connected to a print module package connector assembly 368. Printing array 364 comprises a first print module package column 370, a second print module package column 372, a third print module package column 374, and a fourth print module package column 376. Although thermal print module packages are shown in FIG. 7, inkjet print module packages can be used in addition or in the alternative to thermal print module packages.

Figure 8:
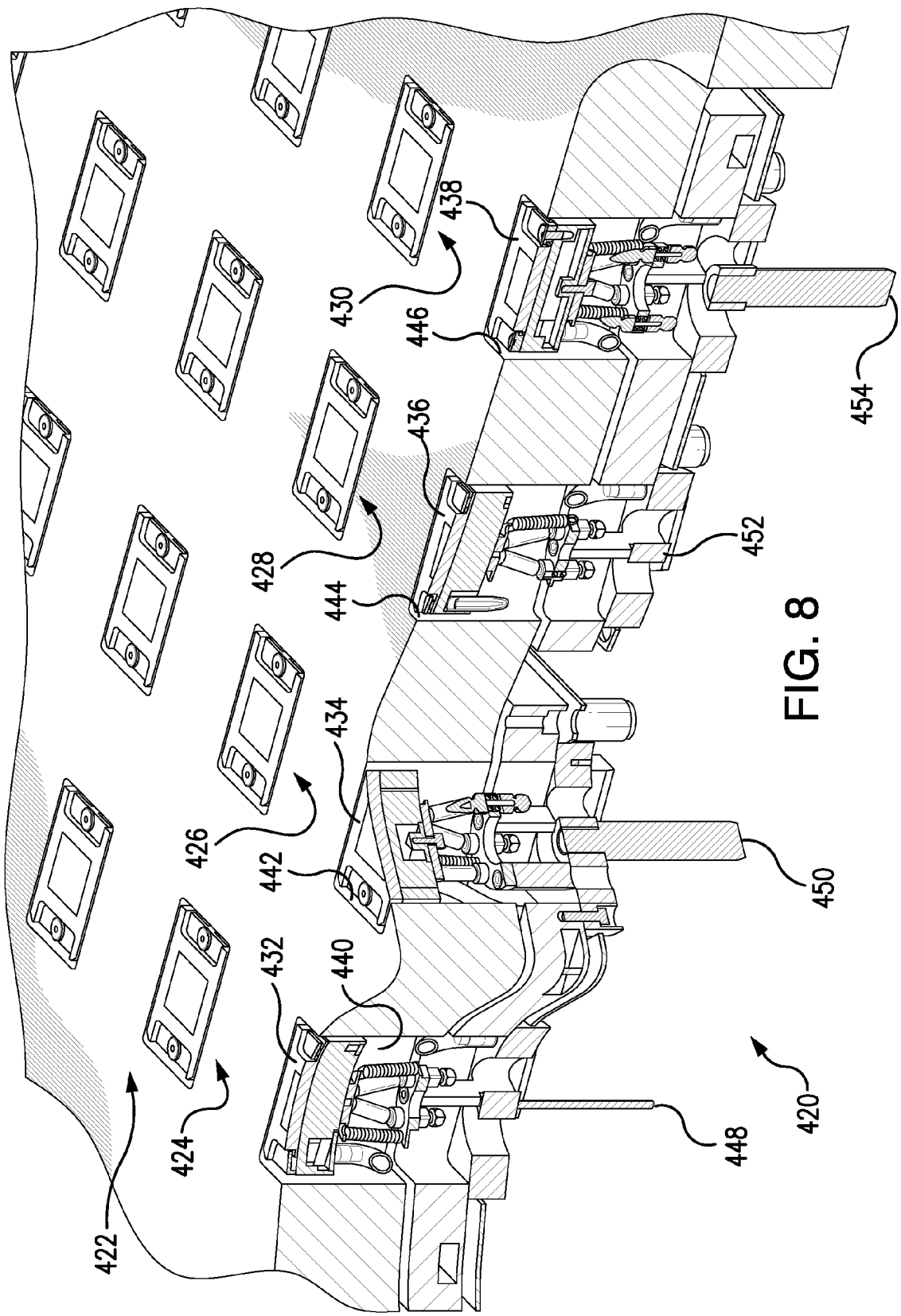
FIG. 8 is a perspective, cross-sectional view of a substrate printing system in accordance with various embodiments of the present teachings and showing cutaway views through four different cross-sections of four respective print module packages.

FIG. 8 is a perspective, cross-sectional view of a substrate printing system 420. Substrate printing system 420 can comprise a thermal printing array 422 that in turn can comprise a first print module package column 424, a second print module package column 426, a third print module package column 428, and a fourth print module package column 430. Thermal printing array 422 comprises a plurality of print module packages, for example, first print module package 432, second print module package 434, third print module package 436, and fourth print module package 438 included within respective print module package columns. First print module package 432 resides within a first print module package receiving cavity 440. Second print module package 434 resides within second print module package receiving cavity 442. Third print module package 436 resides within third print module package receiving cavity 444. Fourth print module package 438 resides within fourth print module package receiving cavity 446. A first print module package connector assembly 448 is connected to first print module package 432, a second print module package connector assembly 450 is connected to second print module package 434, a third first print module package connector assembly 452 is connected to third print module package 436, and a fourth print module package connector assembly 454 is connected to fourth print module package 438. Although thermal print module packages are shown in FIG. 8, inkjet print module packages can be used in addition or in the alternative to thermal print module packages.

Figure 9:
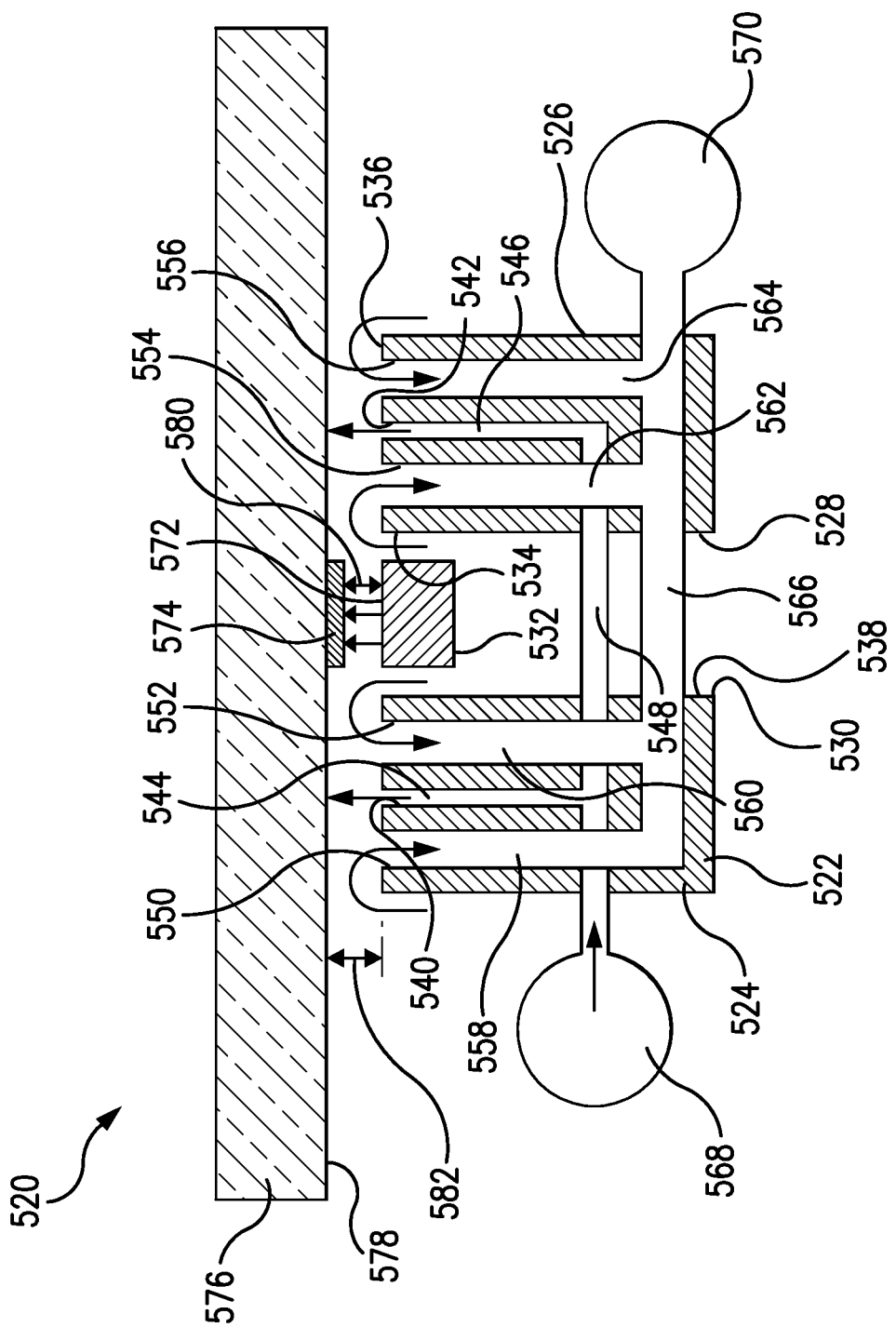
FIG. 9 is a cross-sectional view and schematic diagram of a gas bearing system that can be used in accordance with various embodiments of the present teachings.

FIG. 9 is a cross-sectional, schematic view of a gas bearing system 520 in accordance with various embodiments of the present teachings. Gas bearing system 520 can comprise a housing 522. Housing 522 can comprise a sidewall 524. Sidewall 524 can comprise an exterior surface 526 and an interior surface 528. Interior surface 528 can define an interior cavity 530. Interior cavity 530 can receive print module package 532 through a cavity opening 534. An end surface 536 can be positioned between exterior surface 526 and interior surface 528. A second cavity opening 538 can be positioned opposite cavity opening 534. Within end surface 536 can be provided a first aperture 540 and a second aperture 542. A first gas channel 544 can extend from first aperture 540 into sidewall 524. A second gas channel 546 can extend from second aperture 542 into sidewall 524. First gas channel 544 and second gas channel 546 can be in gaseous communication with a first manifold 548. End surface 536 can further provide a third aperture 550, a fourth aperture 552, a fifth aperture 554, and a sixth aperture 556. A third gas channel 558 can extend from third aperture 550 into sidewall 524. A fourth gas channel 560 can extend from fourth aperture 552 into sidewall 524. A fifth gas channel 562 can extend from fifth aperture 554 into sidewall 524. A sixth channel 564 can extend from sixth aperture 556 into sidewall 524. Third gas channel 558, fourth gas channel 560, fifth gas channel 562, and sixth gas channel 564 can be in gaseous communication with a second manifold 566.

In some embodiments, first manifold 548 can be in gaseous communication with a pressurized gas source 568 and second manifold 566 can be in gaseous communication with a vacuum source 570. Print module package 532 can comprise at least one transfer surface 572. Materials, for example, an ink, can be transferred from transfer surface 572 to a substrate 576. In some embodiments, transfer surface 572 can be part of an inkjet nozzle. A deposited material 574 can thus form on underside surface 578 of substrate 576. A print gap 580 can be defined as the distance between transfer surface 572 and underside surface 578. A gas bearing system gap 582 can be defined as the distance between end surface 536 and substrate surface 578. A set gap can be defined as the difference between print gap 580 and gas bearing system gap 582.

Figure 10:
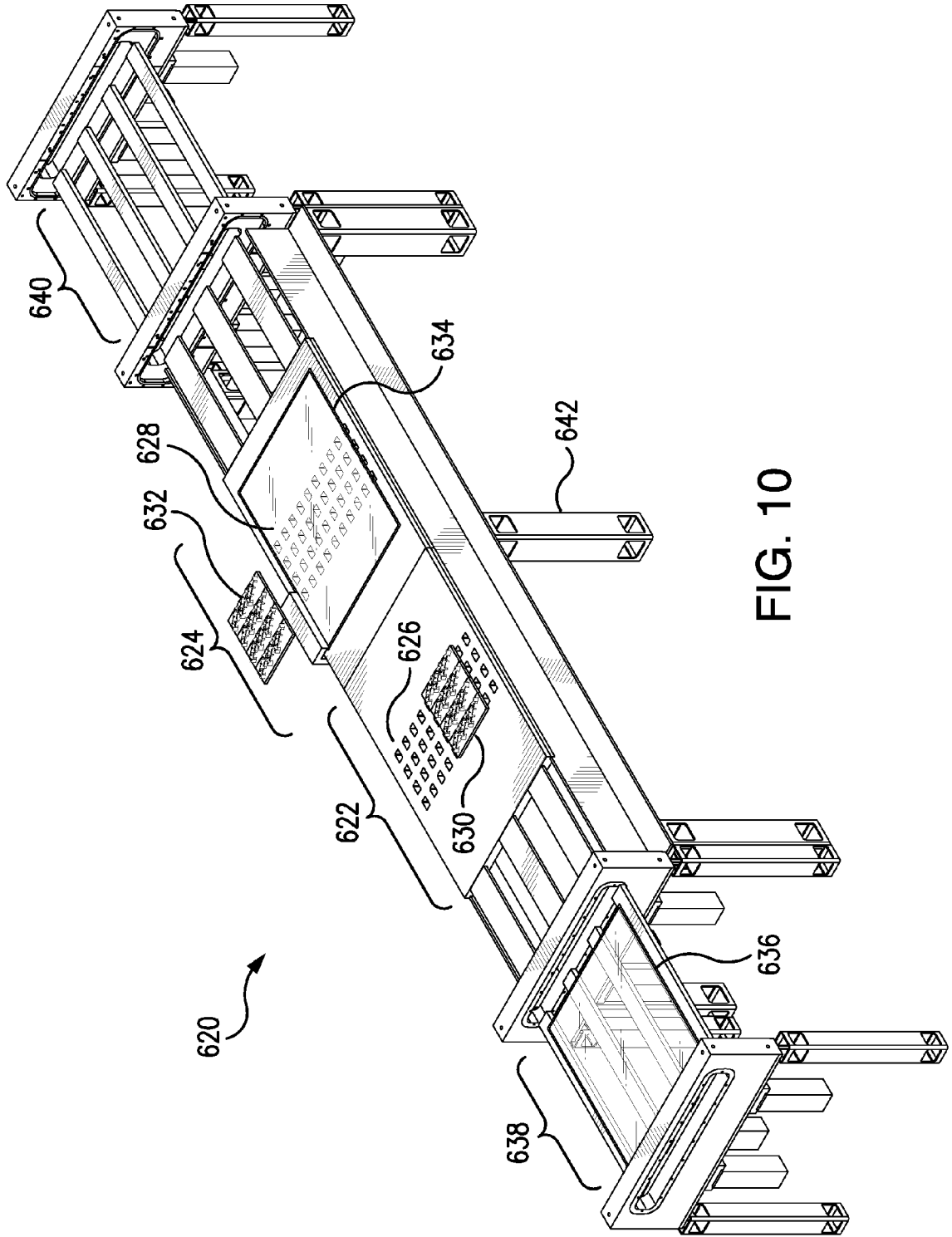
FIG. 10 is a perspective view of a substrate printing system in accordance with yet other various embodiments of the present teachings.
Figure 11:
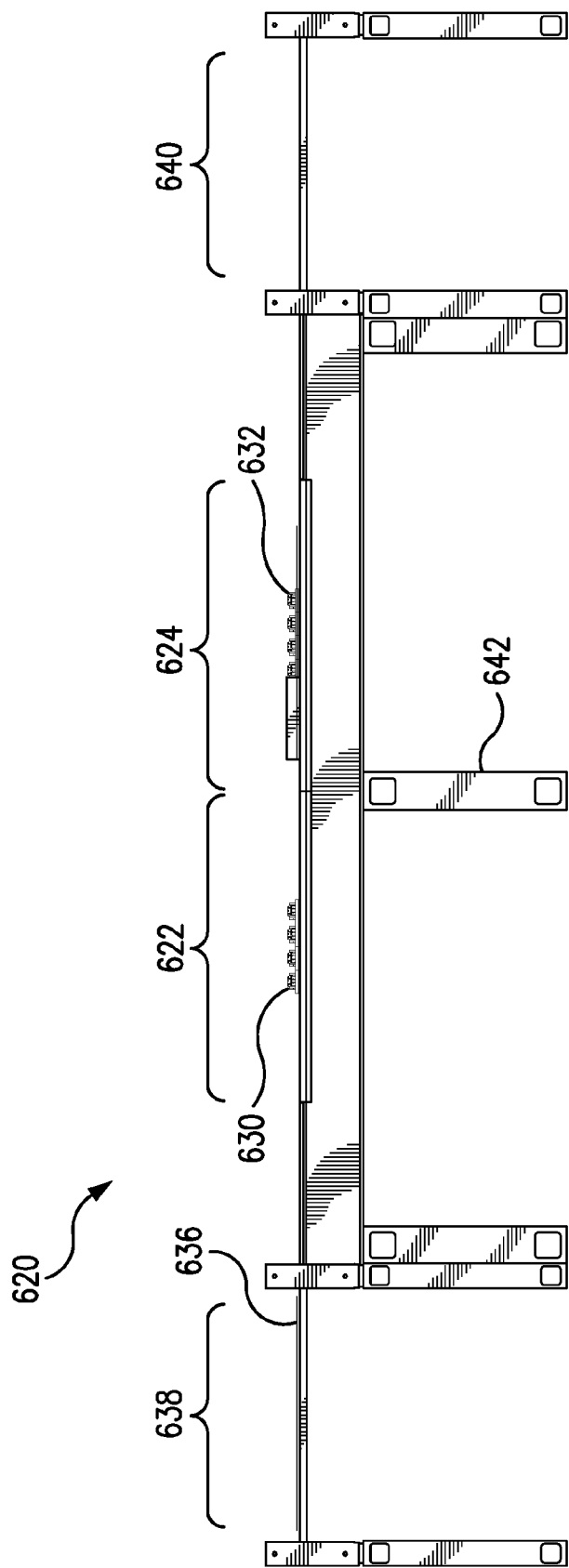
FIG. 11 is a side view of the substrate printing system shown in FIG. 10.
Figure 12:
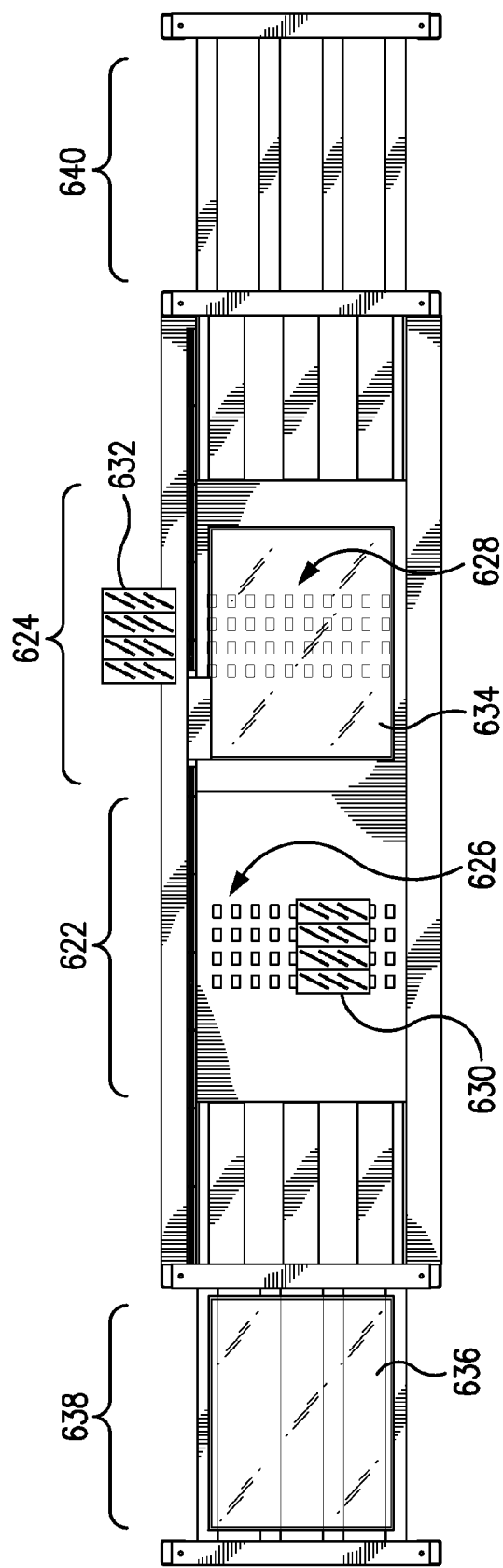
FIG. 12 is a plan view of the substrate printing system shown in FIG. 10.
Figure 13:
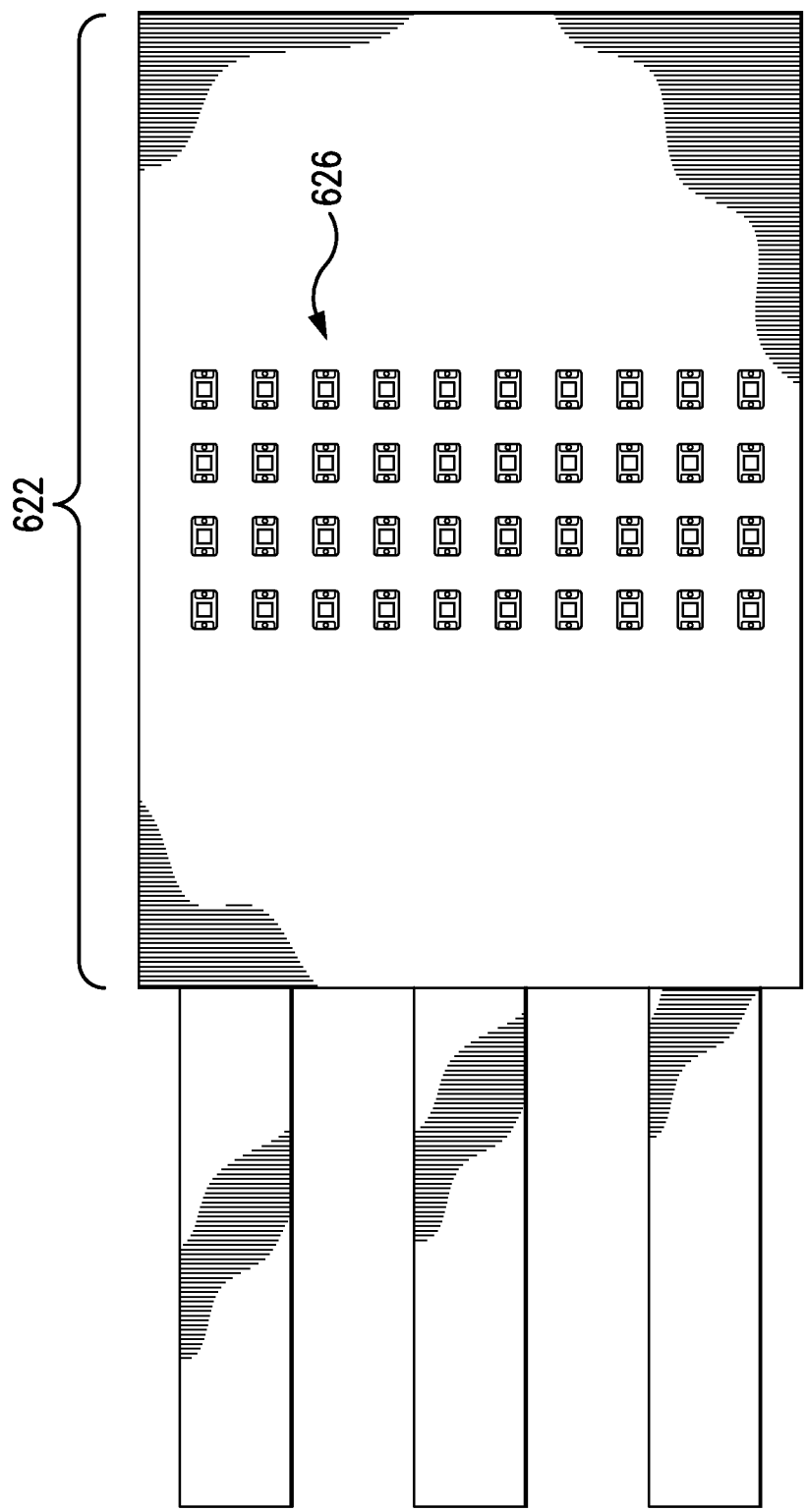
FIG. 13 is an enlarged view of work station 622 of the substrate printing system shown in FIG. 10.

FIG. 10 is a perspective view of a substrate printing system 620 in accordance with various embodiments of the present teachings. FIG. 11 is a side view of substrate printing system 620 shown in FIG. 10. FIG. 12 is a plan view of substrate printing system 620 shown in FIG. 10. FIG. 13 is an enlarged portion of first work station 622 shown in FIG. 10 including a more detailed rendering of a first printing array 626, which can comprise an inkjet printing array and/or a thermal printing array. In FIGS. 10-12 substrate printing system 620 can comprise a first work station 622 and a second work station 624. First work station 622 includes first printing array 626. Second work station 624 includes a second printing array 628. A first inkjet array 630 is shown over first printing array 626 and positioned to apply ink thereto. A second inkjet array 632 is positioned adjacent and aligned with second workstation 624 but retracted and out of the way. In embodiments in which the first and second printing arrays 626, 628 do not comprise thermal printing array, first and second inkjet printing arrays 630, 632 can be omitted. A first substrate or work piece 634 is positioned above second printing array 628 to enable printing onto the underside of substrate 634. A second substrate or work piece 636 is positioned in a first load-lock station 638, ready for loading into work station 622 and/or work station 624. A second load-lock station 640 is empty, ready to accept substrate 634. Substrates 634 and 636 can be moved from one work station to another, as well as to or from a load-lock station, by any suitable system or means, for example, a gas bearing system, actuator, vacuum chuck, driven wheels, or a combination thereof. A plurality of supports, for example, including support 642, can help support and maintain a desired height of substrate printing system 620. Adjustable supports, for example, including a leveling function or fine leveling adjustment capability can be used to ensure a horizontal or substantially horizontal planar top surface of the substrate support.

Figure 14A:
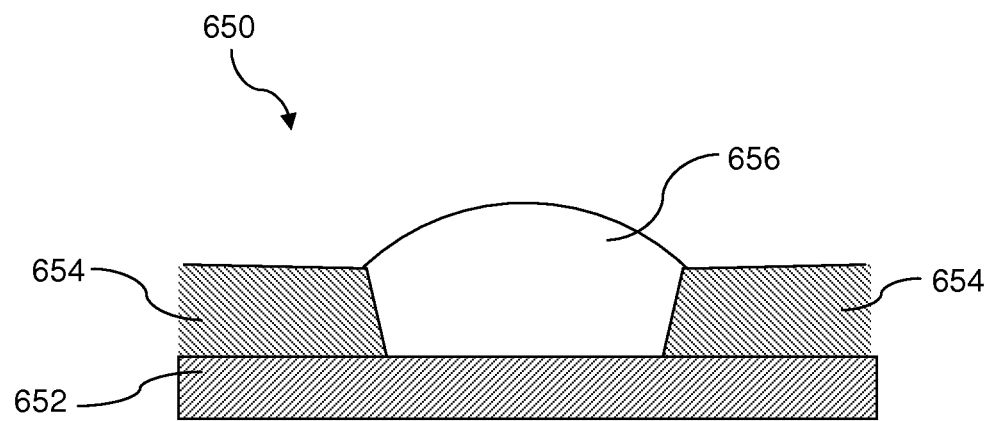
FIG. 14A is a cross-sectional view of a printed substrate including undried pixel material, in accordance with various embodiments of the present teachings.
Figure 14B:
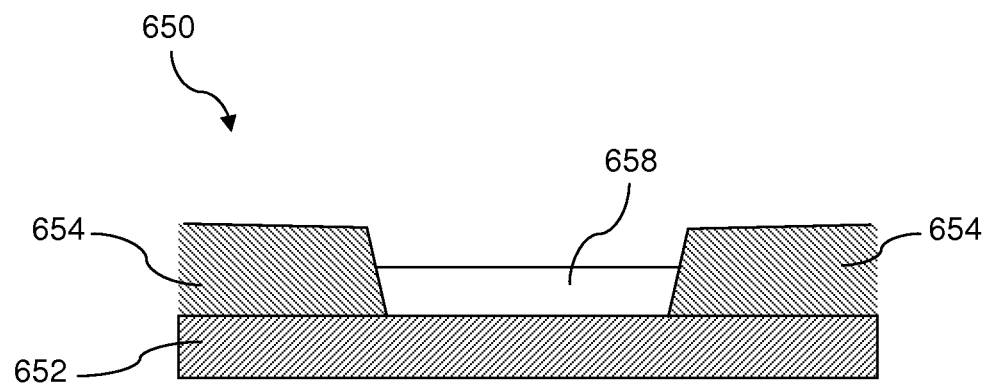
FIG. 14B is a cross-sectional view of the printed substrate shown in FIG. 14A, but wherein the pixel material has been dried.

FIG. 14A is a cross-sectional side view of a printed substrate 650 in accordance with various embodiments of the present teachings. FIG. 14A shows a substrate 652 in an upright configuration. Substrate 652 has been preprinted with a pixel bank 654. Within pixel bank 654 an ink droplet 656 or other film-forming material has been deposited. FIG. 14B is a cross-sectional view of the same printed substrate 650 but wherein the ink or film-forming material has formed a dried film 658 on substrate 652 within pixel bank 654.

Figure 15A:
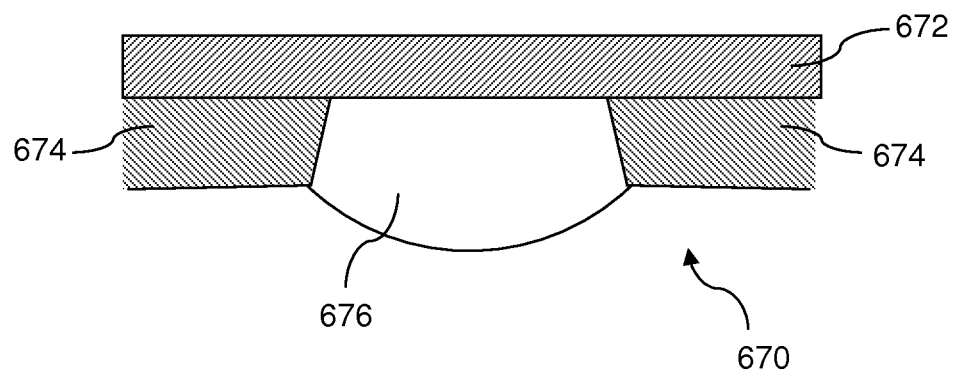
FIG. 15A is a cross-sectional view of a printed substrate in a face-down orientation and including undried pixel material, in accordance with various embodiments of the present teachings.
Figure 15B:
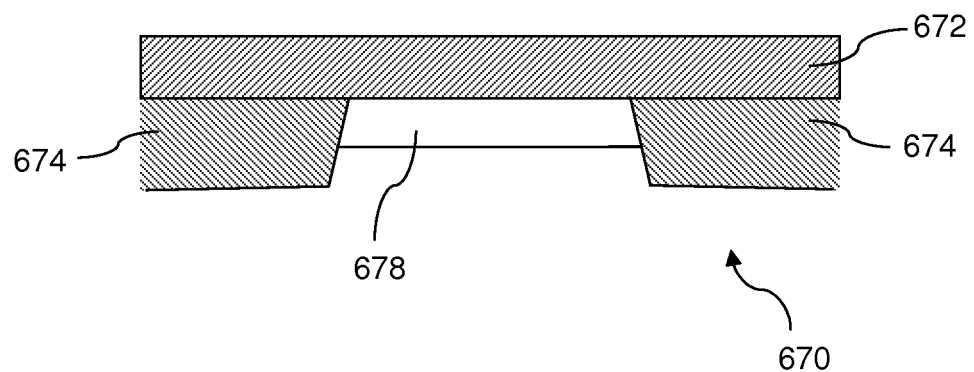
FIG. 15B is a cross-sectional view of the printed substrate shown in FIG. 15A, but wherein the pixel material has been dried.

FIG. 15A is a cross-sectional side view of a printed substrate 670 in accordance with various embodiments of the present teachings. A substrate 672 is shown in a downwardly-facing configuration. A pixel bank 674 has been pre-applied to substrate 672. An ink droplet of a film-forming material 676 has been deposited on substrate 672 within pixel bank 674. FIG. 15B is a cross-sectional view of the same printed substrate 670 shown in FIG. 15A, but wherein the ink or film-forming material has formed a dried film 678 on substrate 672 between and within pixel bank 674. As vacuum thermal evaporation (VTE) is typically done with a substrate glass facing down, it can be advantageous for the inkjet process to be carried out face-down as well. In some embodiments, the present teachings relate to inkjet OLED printing wherein a substrate can be disposed face-down such as in a VTE process. In various embodiments, the present teachings relate to inkjet OLED printing, using inkjet printer steps and vacuum thermal evaporation steps. Printing with the glass facing down can eliminate the need to flip the glass between two different processes such as between inkjet printing and VTE printing or between thermal printing and VTE printing. Printing in a face-down configuration has been found to yield beneficial results with respect to wetting and drying performance. When printing into a pixel cell defined by a pixel bank, ink can spread in the cell by surface tension forces. The pixel banks can be made from any number of different materials, for example, hydrophobic photoresist materials. When the substrate is facing downwards, it has been found that surface tension and capillary forces can work with gravity pulling the ink from the glass substrate. Such a configuration can create different and better conditions for wetting and uniform drying of pixel-forming materials within the confines of one or more pixel banks.

Figure 16:
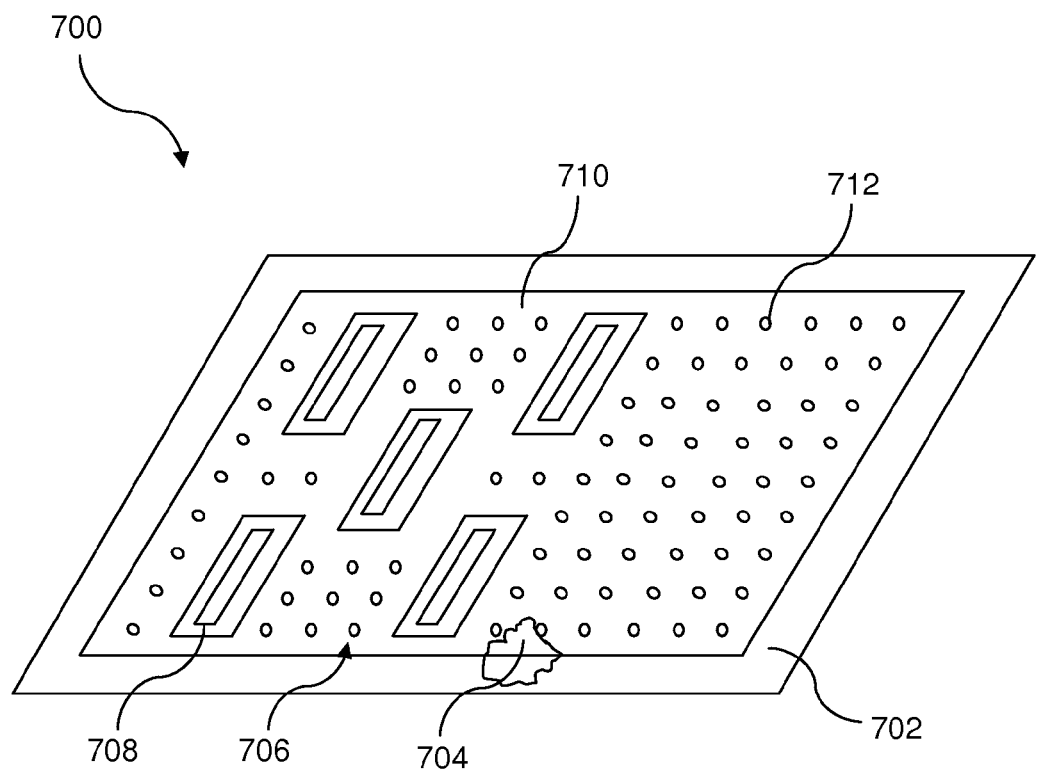
FIG. 16 is a perspective view of a face-down printing system in accordance with various embodiments of the present teachings.

FIG. 16 is a perspective view of a face-down printing system 700 that includes a substrate 702 positioned above a printing apparatus 704. Printing apparatus 704 contains at least one printing array 706. Printing array 706, in turn, comprises one or more printhead columns 708. Printhead column 708 can comprise any number of printheads, for example, two inkjet printheads. Printhead column 708 along with other printhead columns of printing array 706 are set in a gas-bearing system 710, comprising a plurality of apertures 712. Face-down printing system 700 is exemplary of various embodiments of the apparatus, systems, and methods of the present teachings.

Figure 17:
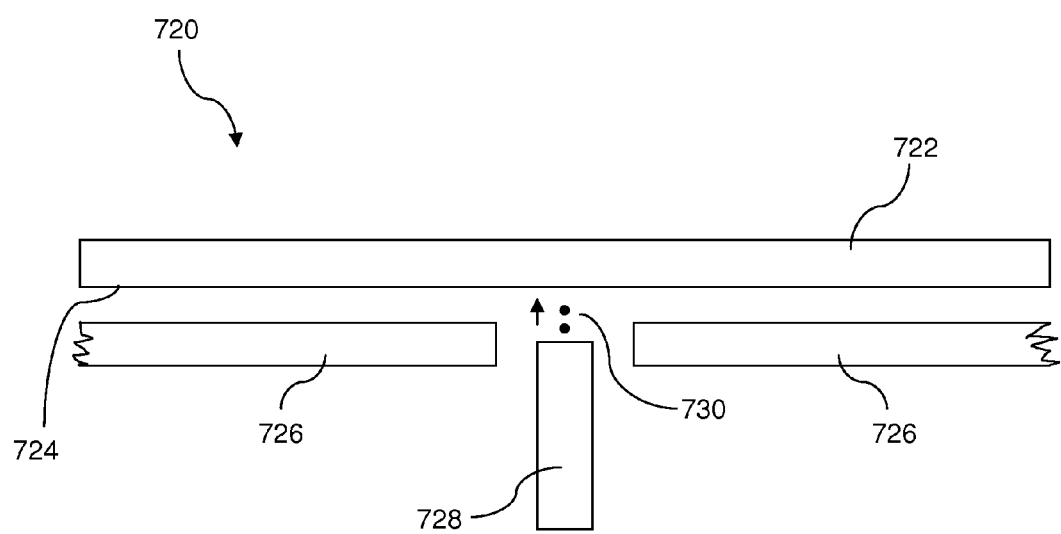
FIG. 17 is a side view of a face-down printing system in accordance with various embodiments of the present teachings.

FIG. 17 shows a side view of a face-down printing system 720 in accordance with various embodiments of the present teachings. A substrate 722 comprising a substrate surface 724 that faces downwardly, is suspended above a gas-bearing system 726. An inkjet printhead 728 is set in gas-bearing system 726. The arrow shown depicts the movement of ink droplets 730 from inkjet printhead 728 toward substrate surface 724. The depiction of face-down printing system 720 is exemplary of various embodiments of the apparatus, systems, and methods of the present teachings.

Figure 18:
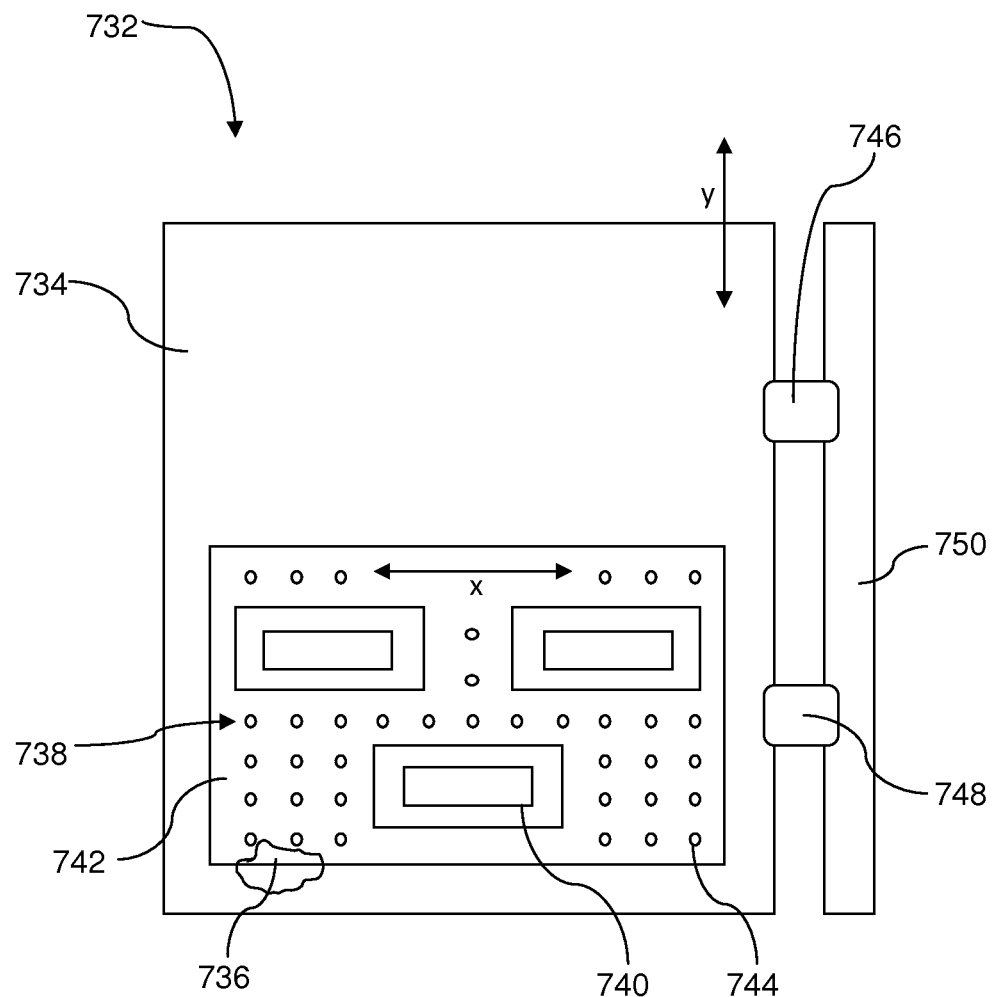
FIG. 18 is a plan view of a face-down printing system in accordance with various embodiments of the present teachings.

FIG. 18 shows a plan view of a face-down printing system 732 in accordance with various embodiments of the present teachings. A substrate 734 is suspended above a printing apparatus 736. Printing apparatus 736 comprises a printing array 738, which, in turn, comprises a printhead column 740. Printhead column 740 can comprise any number and any kind of print module package, for example, an inkjet printhead or a thermal printhead. A combination of printhead types can also be utilized. Printing array 738 is shown set in a gas-bearing system 742 that comprises a plurality of apertures 744. A first substrate holder 746 and a second substrate holder 748 can hold substrate 734. First and second substrate holders 746, 748, are attached to a linear actuator 750. Linear actuator 750 can move the substrate, for example, in a y-axis direction. Printing apparatus 736 can also move in an x-axis direction relative to substrate 734. Face-down printing system 732 is exemplary of various embodiments of the apparatus, systems, and methods of the present teachings.

Figure 19:
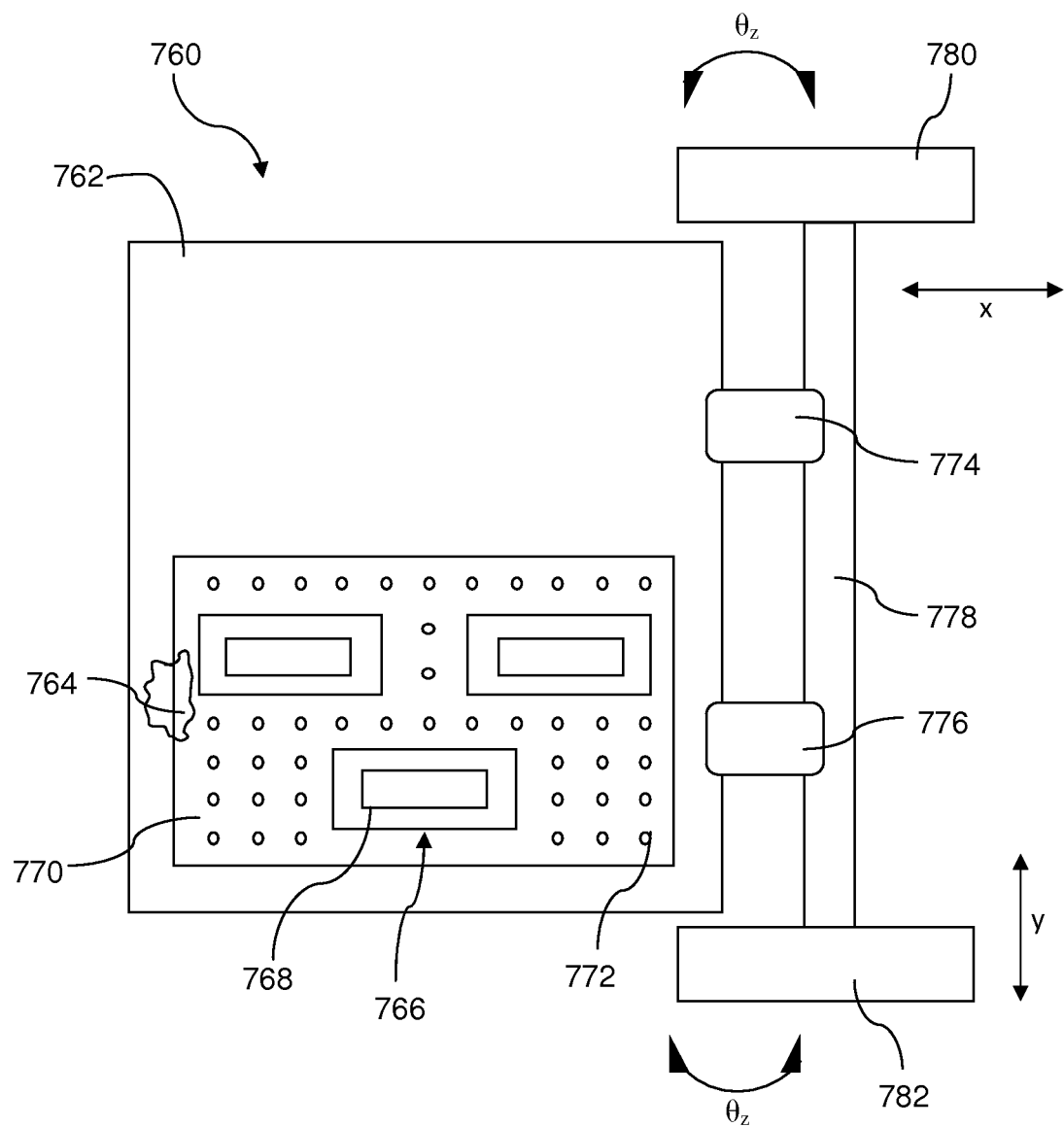
FIG. 19 is a plan view of another face-down printing system in accordance with various embodiments of the present teachings.

FIG. 19 is a plan view of a face-down printing system 760 in accordance with other various embodiments of the present teachings. A substrate 762 is suspended above a printing apparatus 764, comprising at least one printing array 766. Printing array 766 comprises at least one printhead column 768 that can, in turn, comprise any number or kind of print module package. Printing array 766 can be set in a gas-bearing system 770, comprising a plurality of apertures 772. A first substrate holder 774 and a second substrate holder 776 can hold substrate 762. First and second substrate holders 774,776, respectively, can be operatively associated with a linear actuator 778. Linear actuator 778 can be equipped with a first rotational component 780 and/or a second rotational component 782. Linear actuator 778 can be configured to move substrate 762 in both an x-axis direction and a y-axis direction. Linear actuator 778, by virtue of first and second rotational components 780, 782, can rotate substrate 762 in a $\theta_z$ direction, or, by rotating, can effect z-axis movement of substrate 762. Face-down printing system 760 is exemplary of various embodiments of the apparatus, systems, and methods of the present teachings.

Figure 20:
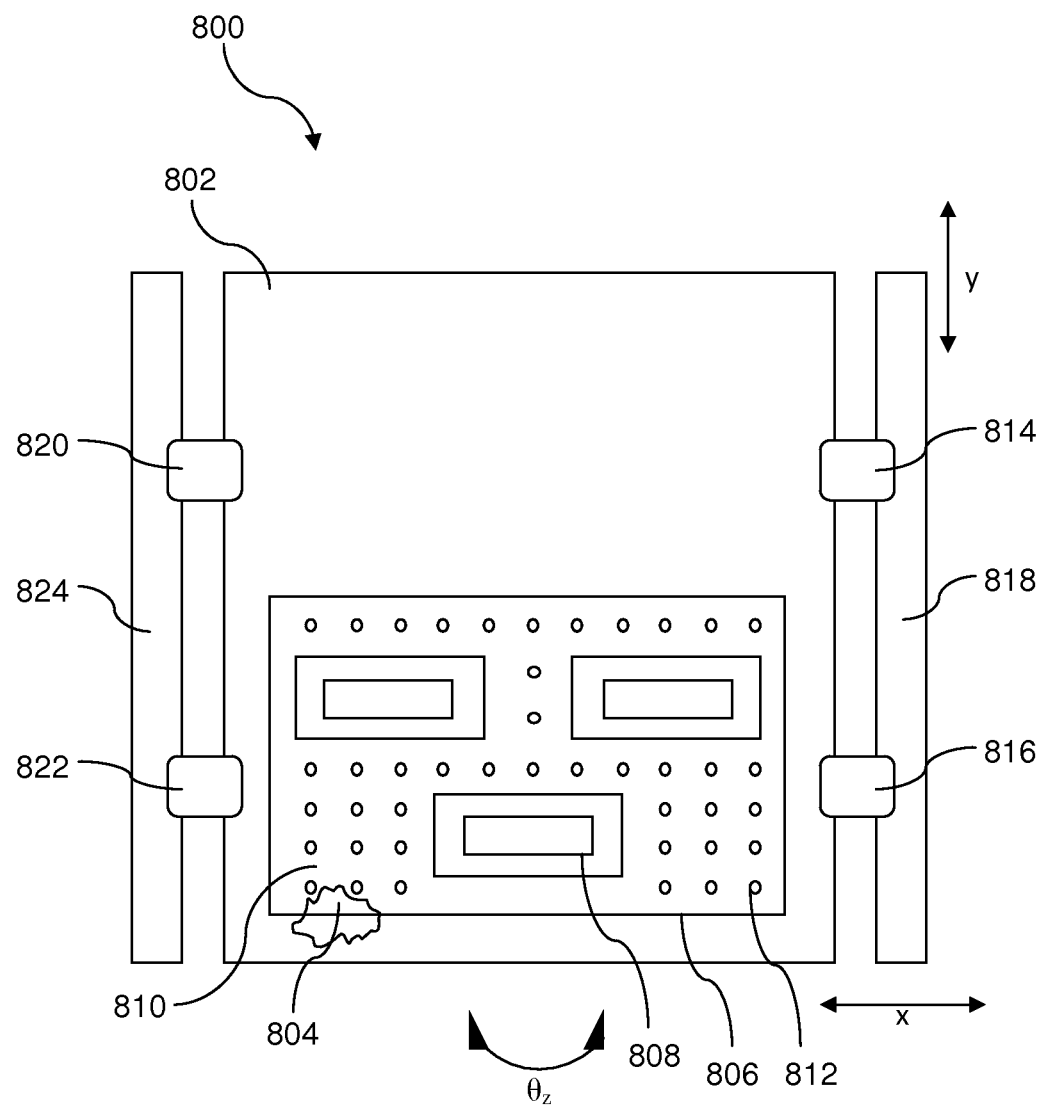
FIG. 20 is a plan view of yet another face-down printing system in accordance with various embodiments of the present teachings.

FIG. 20 is a plan view of another face-down printing system 800 according to various embodiments of the present teachings. A substrate 802 is suspended above a printing apparatus 804 that can comprise one or more printing arrays 806. Printing array 806 can comprise at least one printhead column 808, which, in turn, can comprise any number or type of print module packages. Printing array 806 is set in gas-bearing system 810. Gas-bearing system 810 can comprise a plurality of apertures 812. Substrate 802 is shown held by first, second, third, and fourth substrate holders 814, 816, 820, and 822. First and second substrate holders 814, 816, can be operatively associated with a first linear actuator 818, and third and fourth substrate holders 820, 822, can be operatively associated with a second linear actuator 824. One or both of first linear actuator 818 and second linear actuator 824 can move substrate 802 in a y-axis direction, an x-axis direction, and/or a $\theta_z$ (or z-axis) direction. Face-down printing system 800 is exemplary of various embodiments of the apparatus, systems, and methods of the present teachings.

Figure 21:
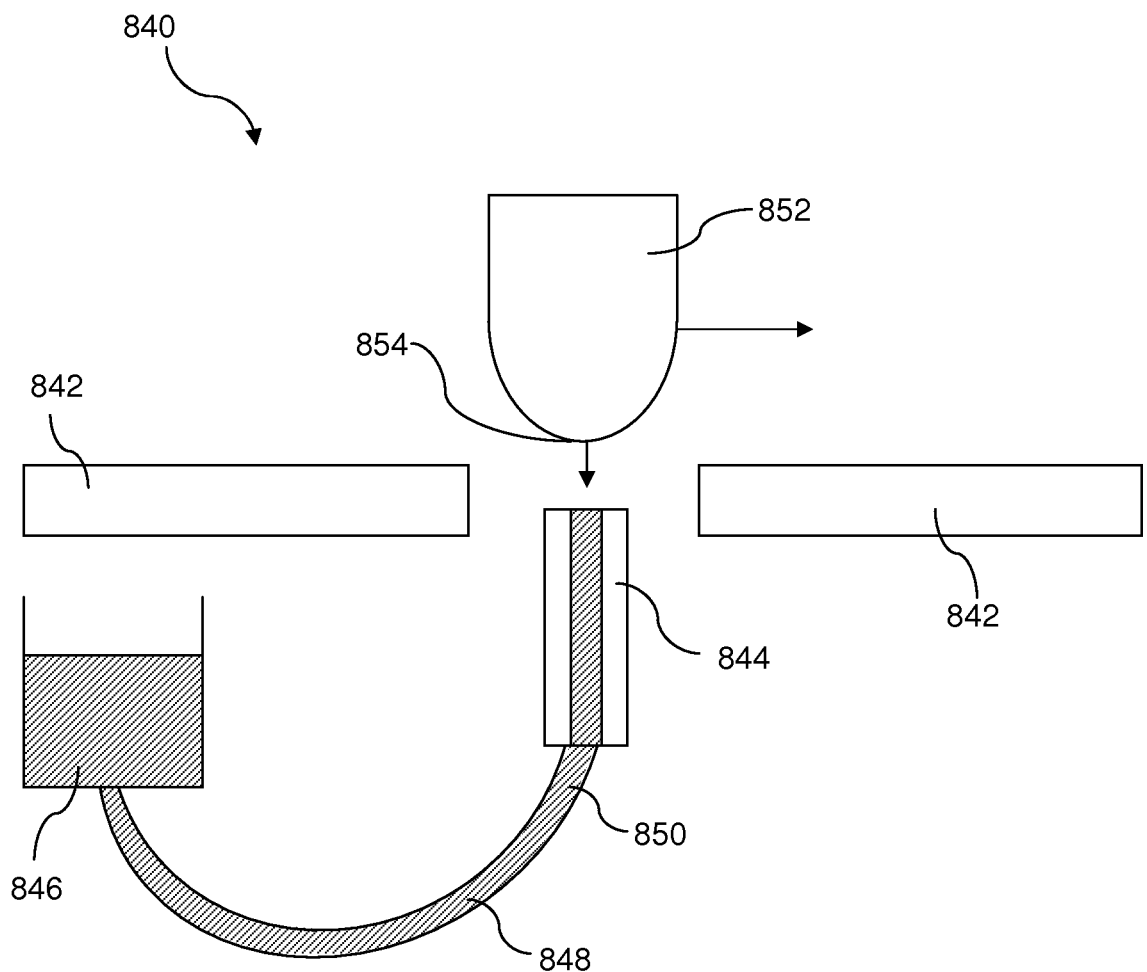
FIG. 21 is a partial cross-sectional side view of a face-down printing system equipped with a blotter, in accordance with various embodiments of the present teachings.

FIG. 21 is a partial cross-sectional side view of a face-down printing system 840 in accordance with various embodiments of the present teachings. An inkjet printhead 844 is set in a gas-bearing system 842. An ink reservoir 846 is in fluid communication with an ink supply line 848 and, in turn, with inkjet printhead 844, which are collectively configured to supply ink to inkjet printhead 844. Blotter 852 is positioned above inkjet printhead 844 and the arrows shown depict the directions of movement in which blotter 852 is configured to move, namely, in both an x,y plane direction and in a z-axis direction. A blotterhead 854 is positioned at the bottom of blotter 852 to allow for contact with inkjet printhead 844. Blotter 852 can be, for example, a squeegee-type blotter, a continuous web blotter, or the like. Face-down printing system 840 is exemplary of various embodiments of the apparatus, systems, and methods of the present teachings.

Figure 22:
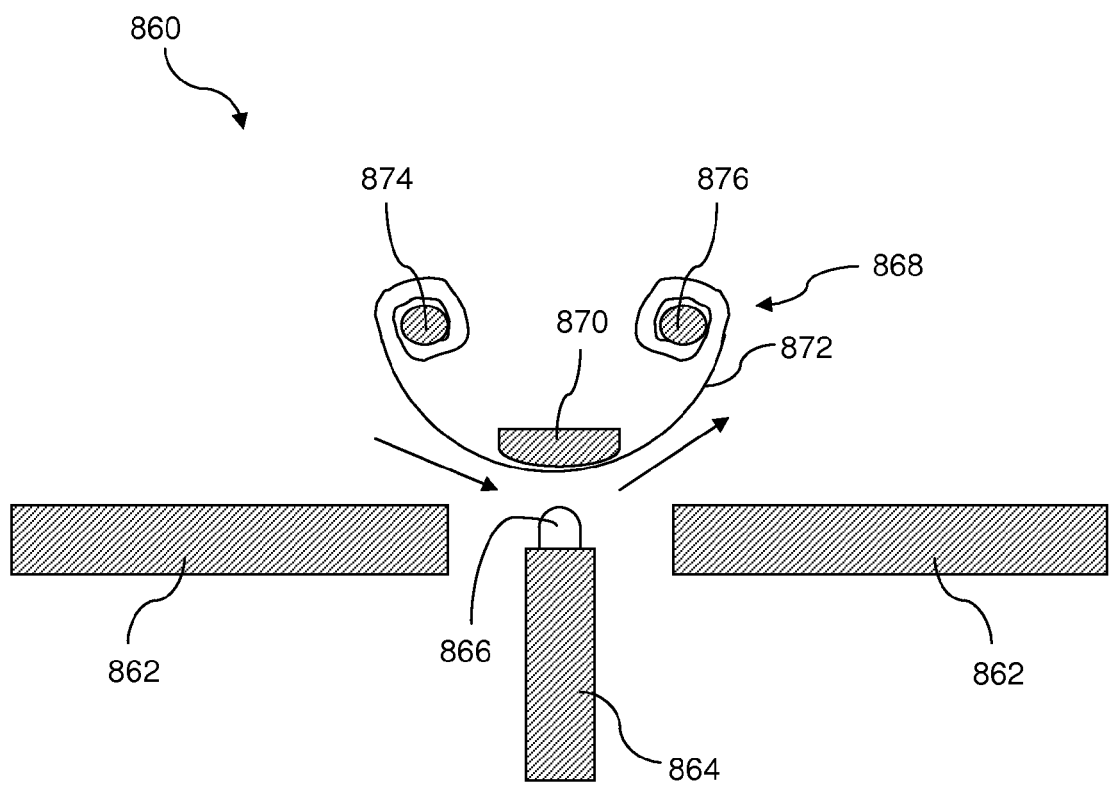
FIG. 22 is a cross-sectional side view of another face-down printing system equipped with a blotter, in accordance with various embodiments of the present teachings.

FIG. 22 is a cross-sectional side view of a face-down printing system 860 in accordance with various embodiments of the present teachings. A gas-bearing system 862 has an inkjet printhead 864 placed within it. A residual, undesired ink droplet 866 is shown resting on inkjet printhead 864. A blotter 868 is positioned above inkjet printhead 864. Blotter 868 comprises a blotterhead 870 upon which a cloth 872 can move across in the direction depicted by the arrows. Movement of cloth 872 can be from a first cloth spool 874 to a second cloth spool 876, or vice versa, or back-and-forth. First cloth spool 874 and/or second cloth spool 876 can be rotated to affect movement of cloth 872. Blotter 868 can be moved in any desired direction so as to allow contact with inkjet printhead 864 and thus enable blotting of inkjet printhead 864 and ink droplet 866. Face-down printing system 860 is exemplary of various embodiments of the apparatus, systems, and methods of the present teachings.

Figure 23:
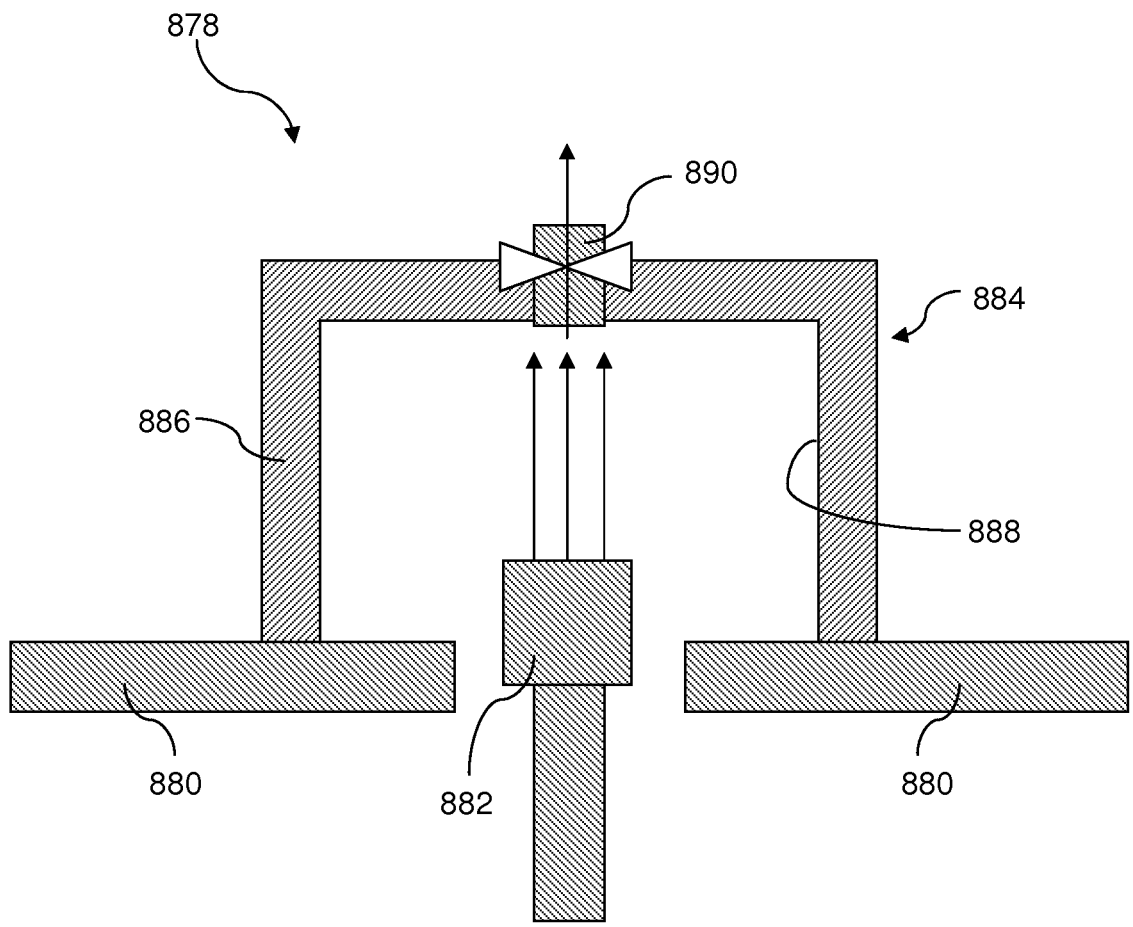
FIG. 23 is a cross-sectional side view of a face-down printing system engaged with a vacuum apparatus, in accordance with various embodiments of the present teachings.

FIG. 23 is a cross-sectional side view of a face-down printing system 878 in accordance with various embodiments of the present teachings. A gas-bearing system 880 is shown with a printhead 882 set within it. A vacuum apparatus 884 is positioned above printhead 882 and in contact with gas-bearing system 880. Vacuum apparatus 884 comprises a vacuum apparatus housing 886 which together with gas-bearing system 880 forms a vacuum chamber 888. A vacuum valve 890 can be situated in vacuum apparatus housing 886 to allow for application of a vacuum to vacuum chamber 888. Face-down printing system 878 is exemplary of various embodiments of the apparatus, systems, and methods of the present teachings.

All publications, patents, and patent applications mentioned in this specification are herein incorporated by reference in their entireties to the same extent as if each individual publication, patent, or patent application was specifically and individually indicated to be incorporated by reference.

While embodiments of the present disclosure have been shown and described herein, it will be obvious to those skilled in the art that such embodiments are provided by way of example only. Numerous variations, changes, and substitutions will now occur to those skilled in the art without departing from the present disclosure. It should be understood that various alternatives to the embodiments of the teachings described herein may be employed in practicing the present teachings.

What is claimed is:

1. A film-forming apparatus comprising:
   a substrate support comprising a top surface and at least one opening in the top surface;
   a gas bearing system comprising a plurality of apertures in the top surface, and a plurality of gas channels extending from the first plurality of apertures into the substrate support and communicating with a manifold, the plurality of apertures surrounding the at least one opening in the top surface; and
   a printing array disposed within the at least one opening and including upwardly facing printheads;
   wherein the gas bearing system is configured to float a substrate above the top surface while the printing array transfers a film-forming material onto a downwardly facing surface of the substrate.

2. The film-forming apparatus of claim 1, further comprising a conveyor configured to move a substrate between a first position not over the printing array, and a second position over the printing array.

3. The film-forming apparatus of claim 1, further comprising a housing over the substrate support, which, with the substrate support, defines a printing chamber in which the printing array prints film-forming material onto a substrate.

4. The film-forming apparatus of claim 3, further comprising a load-lock chamber in interruptible gaseous communication with the printing chamber.

5. The film-forming apparatus of claim 4, wherein the substrate can be moved between the load-lock chamber and the printing chamber.

6. The film-forming apparatus of claim 4, wherein the printing chamber, the load-lock chamber and combinations thereof are configured to provide a controlled environment.

7. The film forming apparatus of claim 6, wherein the controlled environment comprises an inert gas atmosphere.

8. The film forming apparatus of claim 7, wherein the inert atmosphere is substantially free of reactive gases.

9. The film forming apparatus of claim 8, wherein the reactive gases are maintained at less than 100 ppm.

10. The film-forming apparatus of claim 1, wherein the substrate support comprises a first region for supporting a substrate in the first position, and a second region for supporting a substrate in the second position, and the apparatus further comprises a substrate actuator configured to convey a substrate from the first position to the second position.

11. The film-forming apparatus of claim 10, wherein the substrate support has a length and the substrate actuator comprises a linear motor disposed along the length of the substrate support.

12. The film-forming apparatus of claim 10, wherein the substrate actuator comprises an actuator track, an actuator trolley and a substrate holder.

13. The film-forming apparatus of claim 12, wherein the substrate holder is a vacuum chuck, a set of gripping jaws, at least one suction cup, at least one clamp and combinations thereof.

14. The film-forming apparatus of claim 1, wherein the printing array comprises an inkjet printing array.

15. The film forming apparatus of claim 14, wherein the inkjet printing array is configured to print an ink comprising a film-forming material in a carrier liquid.

16. The film forming apparatus of claim 15, wherein the film forming material is an OLED material.

* * * * *